US010143062B2

(12) United States Patent
Uchida et al.

(10) Patent No.: US 10,143,062 B2
(45) Date of Patent: Nov. 27, 2018

(54) ORGANIC ELECTROLUMINESCENCE DEVICE, ILLUMINATION DEVICE, AND DISPLAY DEVICE

(71) Applicant: Sharp Kabushiki Kaisha, Sakai, Osaka (JP)

(72) Inventors: Hideki Uchida, Sakai (JP); Katsuhiro Kikuchi, Sakai (JP); Satoshi Inoue, Sakai (JP); Eiji Koike, Sakai (JP); Masanori Ohara, Sakai (JP); Yuto Tsukamoto, Sakai (JP); Yoshiyuki Isomura, Sakai (JP); Kazuki Matsunaga, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/525,292

(22) PCT Filed: Nov. 6, 2015

(86) PCT No.: PCT/JP2015/081311
§ 371 (c)(1),
(2) Date: May 9, 2017

(87) PCT Pub. No.: WO2016/076221
PCT Pub. Date: May 19, 2016

(65) Prior Publication Data
US 2017/0325314 A1    Nov. 9, 2017

(30) Foreign Application Priority Data

Nov. 12, 2014 (JP) ................................. 2014-229602

(51) Int. Cl.
*H05B 33/14* (2006.01)
*G09F 9/30* (2006.01)
(Continued)

(52) U.S. Cl.
CPC ............ *H05B 33/145* (2013.01); *C09K 11/06* (2013.01); *G09F 9/30* (2013.01); *H01L 27/32* (2013.01);
(Continued)

(58) Field of Classification Search
CPC ...... H05B 33/145; H05B 33/24; C09K 11/06; H01L 51/50; H01L 27/32; G09F 9/30
See application file for complete search history.

(56) References Cited

U.S. PATENT DOCUMENTS

2008/0018230 A1    1/2008   Yamada et al.
2009/0108748 A1    4/2009   Toyoda et al.

FOREIGN PATENT DOCUMENTS

JP    2003-133062 A    5/2003
JP    2003-229283 A    8/2003
(Continued)

*Primary Examiner* — Thomas M Sember
(74) *Attorney, Agent, or Firm* — ScienBiziP, P.C.

(57) ABSTRACT

An organic electroluminescence device according to one aspect of the present invention includes: a base material having a top surface on which a recess is provided; a reflective layer provided along at least a surface of the recess; a filling layer filled in the recess via the reflective layer, the filling layer having light transmissivity; a first electrode provided at least on an upper layer side of the filling layer, the first electrode having light transmissivity; an organic layer provided on an upper layer side of the first electrode, the organic layer including at least a light emitting layer; and a second electrode provided on an upper layer side of the organic layer, the second electrode having light transmissivity. The second electrode has a reflectance of 70% or less.

20 Claims, 13 Drawing Sheets

(51) Int. Cl.
    *H01L 51/50*     (2006.01)
    *H01L 27/32*     (2006.01)
    *H05B 33/24*     (2006.01)
    *C09K 11/06*     (2006.01)
    *H01L 51/00*     (2006.01)
    *H01L 51/52*     (2006.01)

(52) U.S. Cl.
    CPC .............. *H01L 51/50* (2013.01); *H05B 33/24* (2013.01); *H01L 51/0023* (2013.01); *H01L 51/5212* (2013.01); *H01L 2251/5361* (2013.01)

(56) References Cited

FOREIGN PATENT DOCUMENTS

| | | | |
|---|---|---|---|
| JP | 2005-317302 A | 11/2005 | |
| JP | 2006-221902 A | 8/2006 | |
| JP | 2006-269387 A | 10/2006 | |
| JP | 2009-110872 A | 5/2009 | |
| JP | 2009-151955 A | 7/2009 | |

ORGANIC ELECTROLUMINESCENCE DEVICE, ILLUMINATION DEVICE, AND DISPLAY DEVICE

TECHNICAL FIELD

Some aspects of the present invention relate to an organic electroluminescence device, an illumination device and a display device.

Priority is claimed on Japanese Patent Application No. 2014-229602, filed Nov. 12, 2014, the content of which is incorporated herein by reference.

BACKGROUND ART

As one form of a display device, a self-luminous type display device, for example, an organic electroluminescence display device, is known. Electro-luminescence will be abbreviated as "EL" below. In an organic EL display device, light emitted from a light emitting layer travels in all directions, and some of the light is totally reflected due to a refractive index difference between a light emitting element and an external space (air). Most of the light totally reflected at the interface between the light emitting element and the air is confined in the light emitting element and is not extracted to the external space. For example, when the refractive index of the light emitting layer is 1.8, about 20% of the light emitted from the light emitting layer is extracted to the external space and the remaining about 80% of light is confined in the light emitting layer. As a result, the organic EL device of the related art has a problem of low light use efficiency.

In the following Patent Document 1, an organic EL display device including a support substrate, an organic EL element provided on the support substrate, and a light reflection layer at which light emitted from the organic EL element is reflected is disclosed. In the organic EL display device, in the light reflection layer, a recess including an inclined surface along the outer edge of an organic light-emitting layer is provided. Light emitted from the organic light-emitting layer is reflected at the inclined surface of the recess and is then returned to the organic EL element again. In such a configuration, it is possible to prevent degradation of image quality such as bleeding and improve light use efficiency, which are described in the Patent Document 1.

PRIOR ART DOCUMENTS

Patent Documents

[Patent Document 1]
Japanese Patent Application Publication No. 2003-229283

SUMMARY OF THE INVENTION

Problem to be Solved by the Invention

In Patent Document 1, the light reflection layer bends a travelling direction of a light emitting component being guided and thus light extraction efficiency is improved. However, since the upper electrode is a translucent electrode, a light component that should be emitted to the front surface is reflected into a groove again. Light entering the groove again has an angle that is changed due to reflection at the reflective layer. Therefore, a light component emitted in the forward direction may be reduced in magnitude. Accordingly, the light extraction efficiency may not be higher than the expected efficiency, and particularly, there is a problem that forward luminance may not be significantly higher.

An aspect of the present invention provides an organic electroluminescence device, an illumination device and a display device through which it is possible to effectively improve forward luminance.

Means for Solving the Problems

An organic electroluminescence device according to one aspect of the present invention includes: a base material having a top surface on which a recess is provided; a reflective layer provided along at least a surface of the recess; a filling layer filled in the recess via the reflective layer, the filling layer having light transmissivity; a first electrode provided at least on an upper layer side of the filling layer, the first electrode having light transmissivity; an organic layer provided on an upper layer side of the first electrode, the organic layer including at least a light emitting layer; and a second electrode provided on an upper layer side of the organic layer, the second electrode having light transmissivity, wherein the second electrode has a reflectance of 70% or less.

In the organic electroluminescence device according to one aspect of the present invention, a configuration may be used that the second electrode has a light transmittance of 30% or more.

In the organic electroluminescence device according to one aspect of the present invention, a configuration may be used that the second electrode includes a metal layer.

In the organic electroluminescence device according to one aspect of the present invention, a configuration may be used that a transparent conductive film is laminated on the metal layer.

In the organic electroluminescence device according to one aspect of the present invention, a configuration may be used that the second electrode is a transparent conductive film.

In the organic electroluminescence device according to one aspect of the present invention, a configuration may be used that the organic layer includes a doping layer that is obtained by doping an electron transporting material with a metal or a metal compound and has an electron injection function.

In the organic electroluminescence device according to one aspect of the present invention, a configuration may be used that an auxiliary electrode made of a metal that is electrically connected to the second electrode is provided.

In the organic electroluminescence device according to one aspect of the present invention, a configuration may be used that low refractive index layers whose refractive indexes are lower than that of the second electrode are provided on the second electrode.

In the organic electroluminescence device according to one aspect of the present invention, a configuration may be used that the plurality of low refractive index layers are laminated on the second electrode.

In the organic electroluminescence device according to one aspect of the present invention, a configuration may be used that, among the plurality of low refractive index layers, the low refractive index layer on the upper layer side has a lower refractive index than that of the low refractive index layer on the lower layer side.

In the organic electroluminescence device according to one aspect of the present invention, a configuration may be used that an upper part has a lower refractive index than that of a lower part in the low refractive index layer.

In the organic electroluminescence device according to one aspect of the present invention, a configuration may be used that a part of the reflective layer is in contact with a part of the first electrode.

In the organic electroluminescence device according to one aspect of the present invention, a configuration may be used that a bottom surface of the first electrode at a position of the recess is positioned lower than a plane including a top surface of the base material.

In the organic electroluminescence device according to one aspect of the present invention, a configuration may be used that the recess has a cross-sectional shape in at least one axial direction that is an arc shape.

An illumination device according to one aspect of the present invention includes: a base material having a top surface on which a recess is provided; a reflective layer provided along at least a surface of the recess; a filling layer filled in the recess via the reflective layer, the filling layer having light transmissivity; a first electrode provided at least on an upper layer side of the filling layer, the first electrode having light transmissivity; an organic layer provided on an upper layer side of the first electrode, the organic layer including at least a light emitting layer; and a second electrode provided on an upper layer side of the organic layer, the second electrode having light transmissivity, wherein the second electrode has a light reflectance of 70% or less.

A display device according to one aspect of the present invention includes: a base material having a top surface on which a recess is provided; a reflective layer provided along at least a surface of the recess; a filling layer filled in the recess via the reflective layer, the filling layer having light transmissivity; a first electrode provided at least on an upper layer side of the filling layer, the first electrode having light transmissivity; an organic layer provided on an upper layer side of the first electrode, the organic layer including at least a light emitting layer; and a second electrode provided on an upper layer side of the organic layer, the second electrode having light transmissivity, wherein the second electrode has a light reflectance of 70% or less.

Effect of the Invention

According to an aspect of the present invention, it is possible to realize an organic EL device, an illumination device, and a display device through which it is possible to effectively improve forward luminance.

BRIEF DESCRIPTIONS OF THE DRAWINGS

Figure 8:
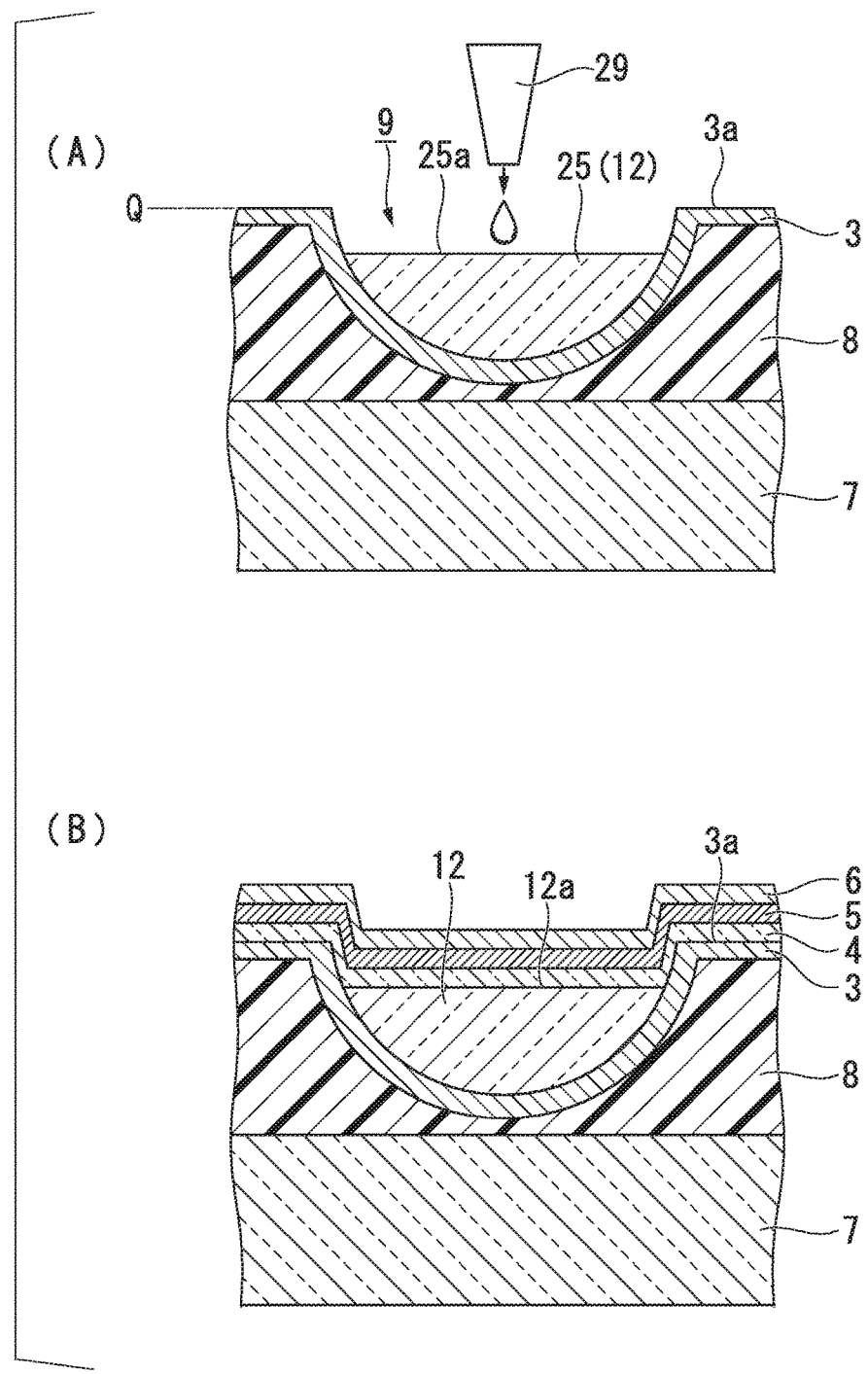

FIGS. 8(A) and 8(B) show cross-sectional views of a process of manufacturing the organic EL device according to the first embodiment.

Figure 9:
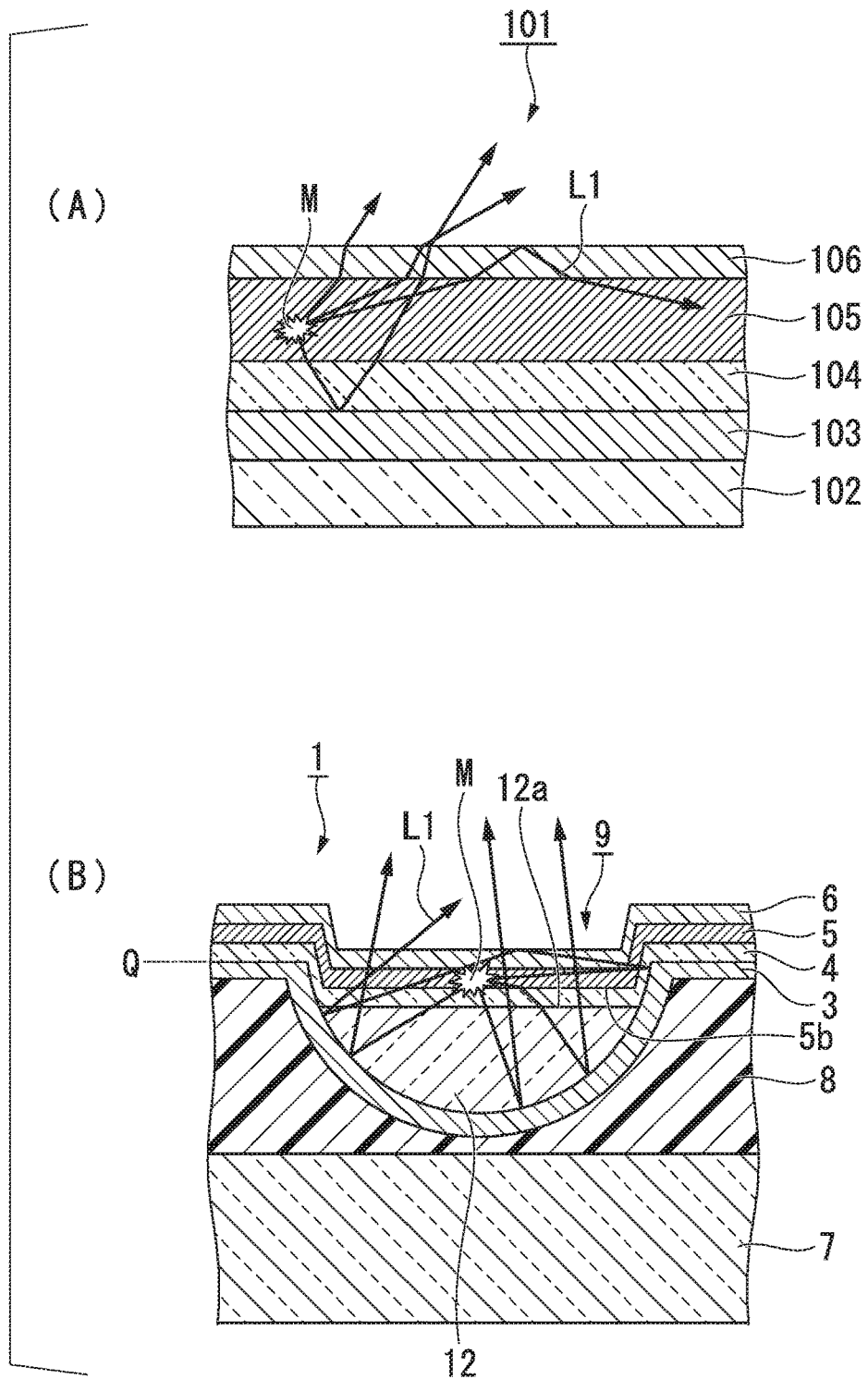

FIG. 9(A) is a cross-sectional view for describing a problem of an organic EL device of the related art, and FIG. 9(B) is a cross-sectional view for describing an operation of the organic EL device according to the present embodiment.

Figure 10:
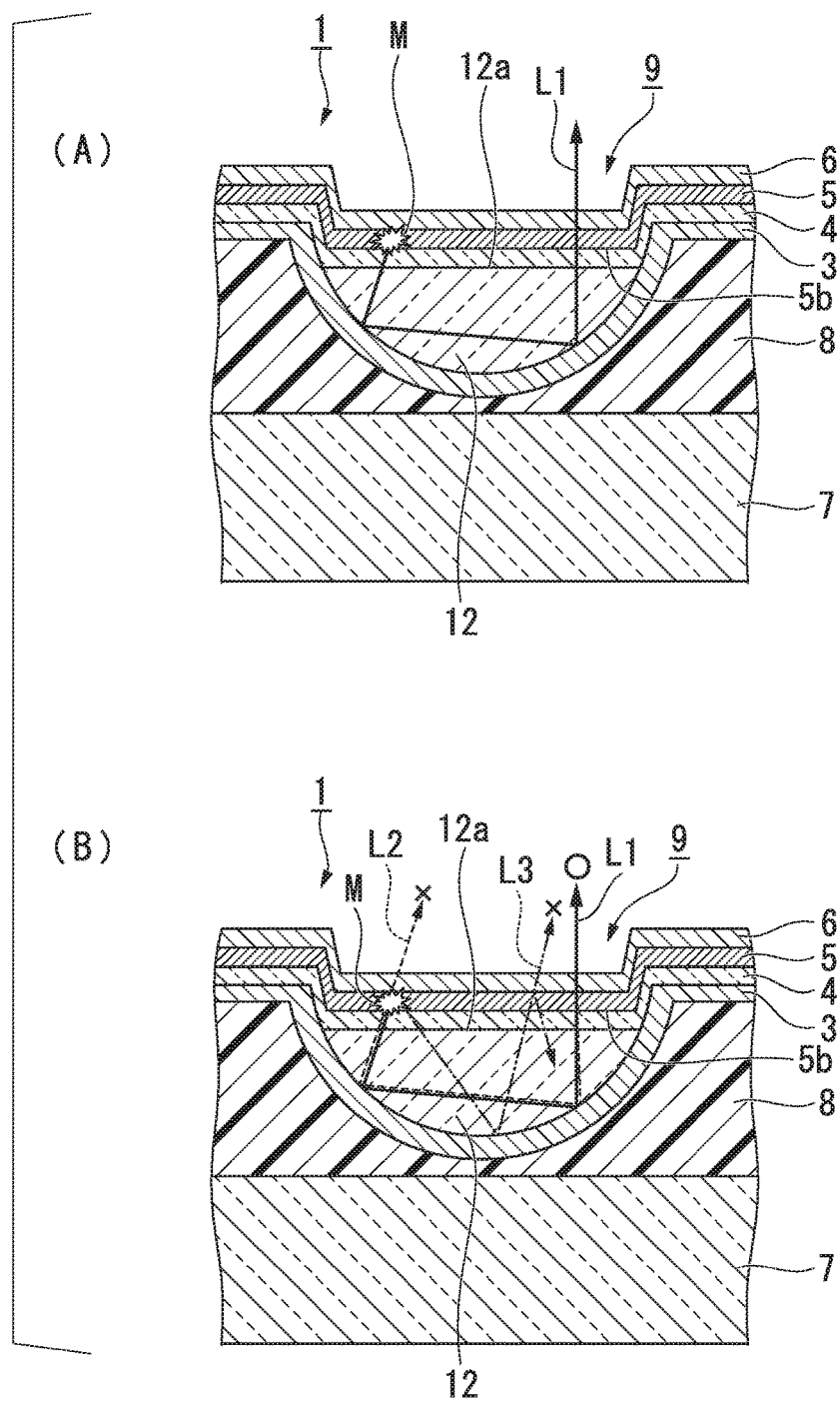

FIG. 10(A) is a diagram showing an example of a component emitted to a front surface within a light emitting component, and FIG. 10(B) is a diagram showing an example of a process in which a light component emitted to a front surface is reflected at a second electrode, and enters a recess structure again.

Figure 11:
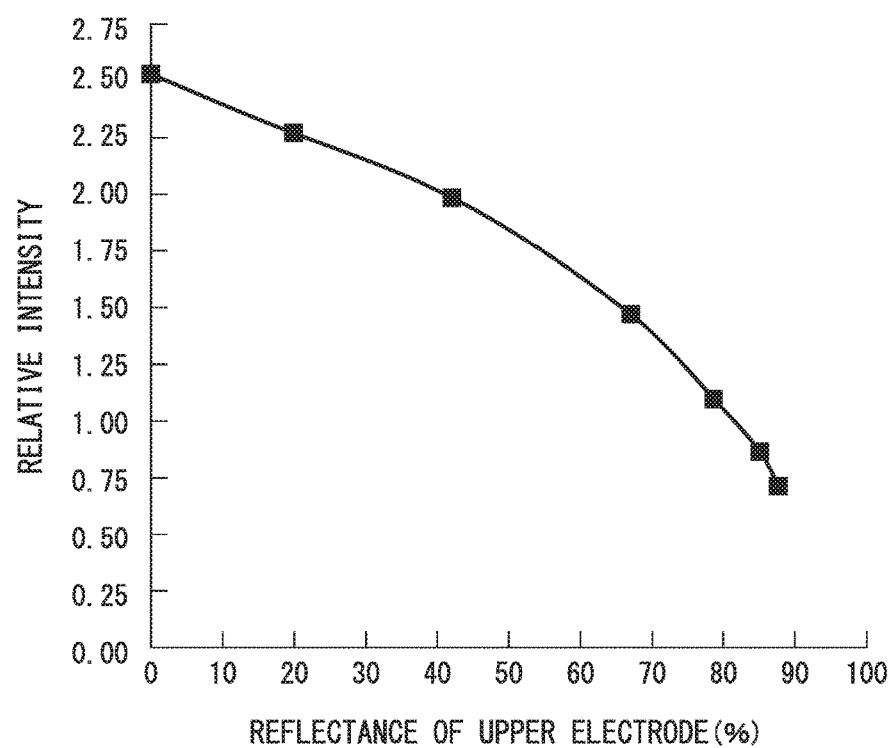

FIG. 11 is a graph showing a comparison between a light reflectance of a second electrode and a relative intensity.

Figure 12:
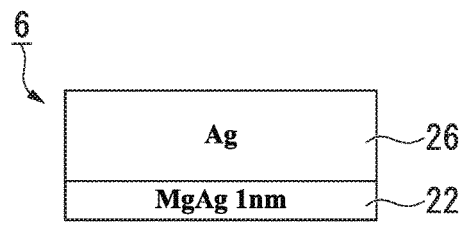

FIG. 12 is a diagram showing a structure of a second electrode in the organic EL device according to the first embodiment.

Figure 13:
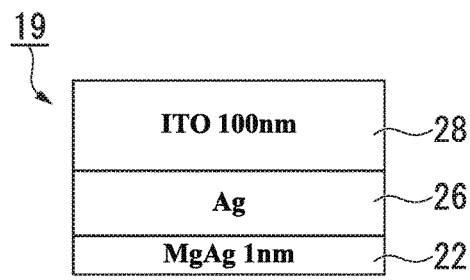

FIG. 13 is a diagram showing a structure of a second electrode in an organic EL device according to a second embodiment.

Figure 14:
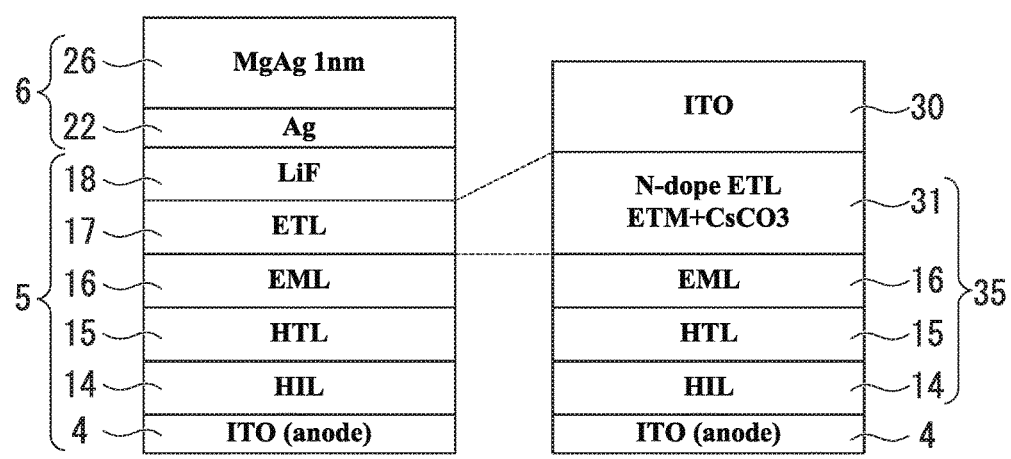

FIG. 14 is a diagram showing a difference of structures of second electrodes and light emitting layers between an organic EL device (the right drawing) of a third embodiment and the organic EL device (the left drawing) of the first embodiment.

Figure 15:
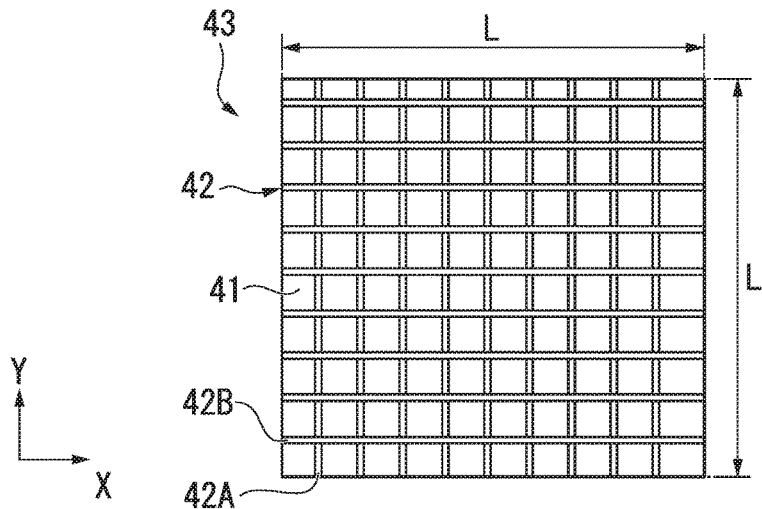

FIG. 15 is a top surface view showing auxiliary electrodes of a second electrode of an organic EL device according to a fourth embodiment.

Figure 16:
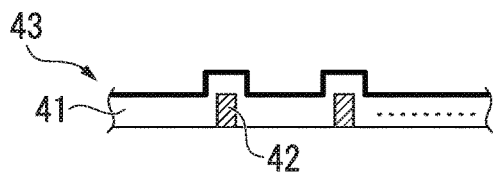

FIG. 16 is a cross-sectional view showing a configuration of a second electrode.

Figure 17:
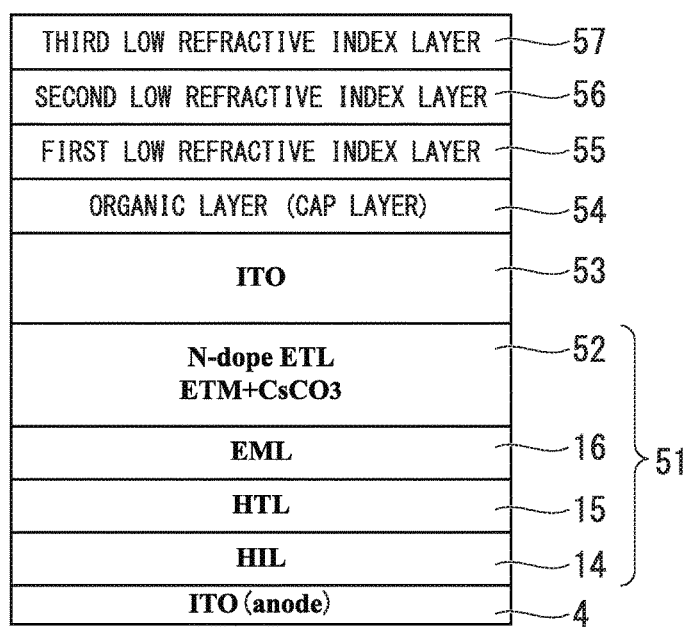

FIG. 17 is a diagram showing a configuration of a light emitting element in an organic EL device according to a fifth embodiment.

Figure 18:
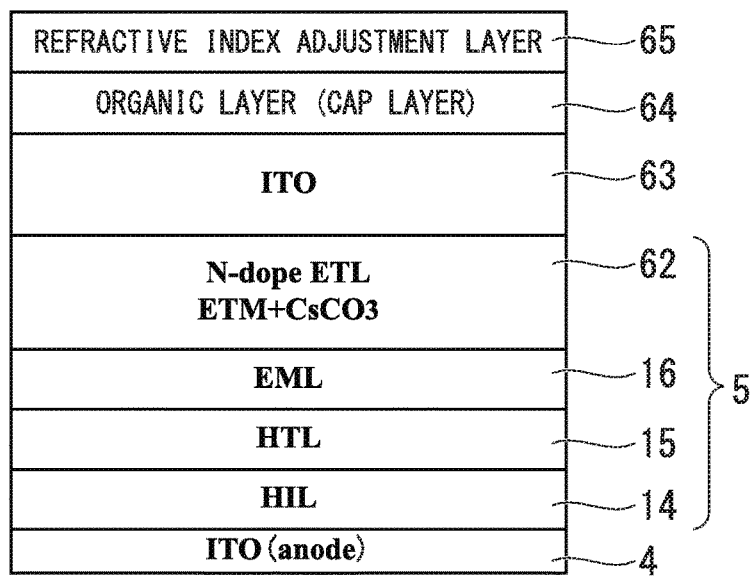

FIG. 18 is a diagram showing a configuration of a light emitting element in an organic EL device according to a sixth embodiment.

Figure 19:
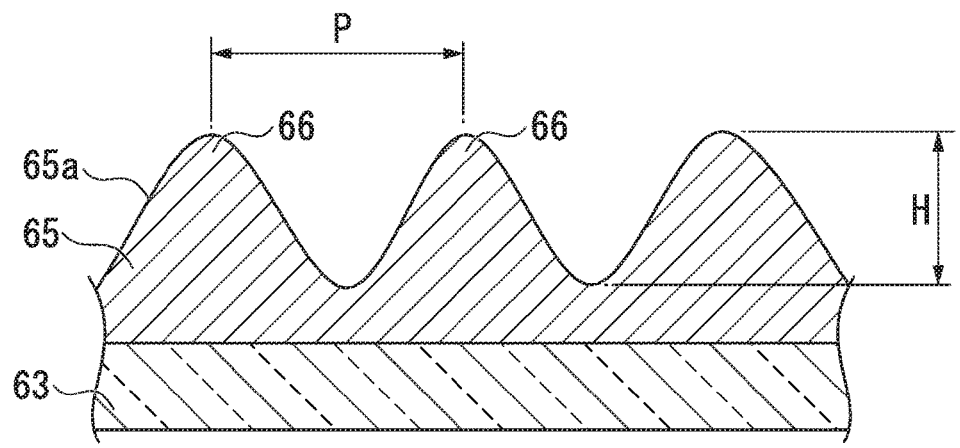

FIG. 19 is a partially enlarged cross-sectional view showing a configuration of a refractive index adjustment layer.

EMBODIMENTS FOR CARRYING OUT THE INVENTION

Embodiments of the present invention will be described below with reference to the drawings. Note that, in the drawings used in the following description, scales of members are appropriately changed in order for the members to be made recognizable sizes.

First Embodiment

A first embodiment of the present invention will be described below with reference to FIG. 1 to FIG. 12.

An organic EL device of the first embodiment is one example of a top emission type organic EL device having a microcavity structure.

Figure 1:
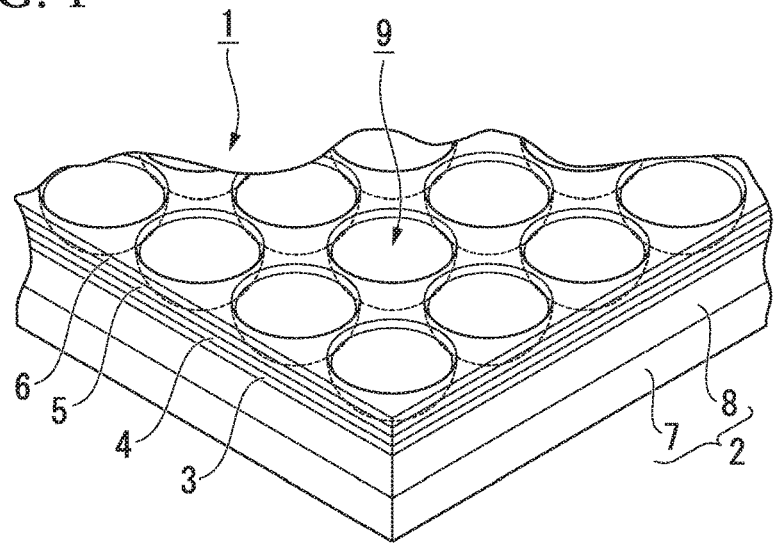
FIG. 1 is a perspective view of an organic EL device according to a first embodiment.

FIG. 1 is a perspective view of the organic EL device of the first embodiment.

As shown in FIG. 1, an organic EL device 1 of the present embodiment includes a base material 2, a reflective layer 3, a filling layer 12 (FIG. 3), a first electrode 4, an organic layer 5 including a light emitting layer, and a second electrode 6. The organic EL device 1 is a top emission type organic EL device and light emitted from the light emitting layer is emitted from the second electrode 6. The base material 2 includes a substrate 7 and an underlayer 8. On a top surface of the substrate 7, the underlayer 8, the reflective layer 3, the filling layer 12 (FIG. 3), the first electrode 4, the organic layer 5, and the second electrode 6 are laminated in that order from the substrate 7. A plurality of recesses 9 are provided on a top surface (a light emission surface) of the organic EL device 1.

The organic EL device 1 includes a plurality of unit light emitting areas that are divided from each other. The plurality of unit light emitting areas include a red light emitting area in which red light is emitted, a green light emitting area in which green light is emitted, and a blue light emitting area in which blue light is emitted. The red light emitting area, the green light emitting area, and the blue light emitting area have the same configuration except that constituent materials of light emitting layers are different from each other.

The organic EL device 1 can be used as an illumination device that generates white light by simultaneously emitting, for example, red light, green light and blue light.

However, applications of the organic EL device 1 are not limited to this illumination device. For example, the organic EL device 1 can be applied to a display device in which a red light emitting area, a green light emitting area and a blue light emitting area form a red subpixel, a green subpixel and a blue subpixel, and these three subpixels constitute one pixel.

Figure 2:
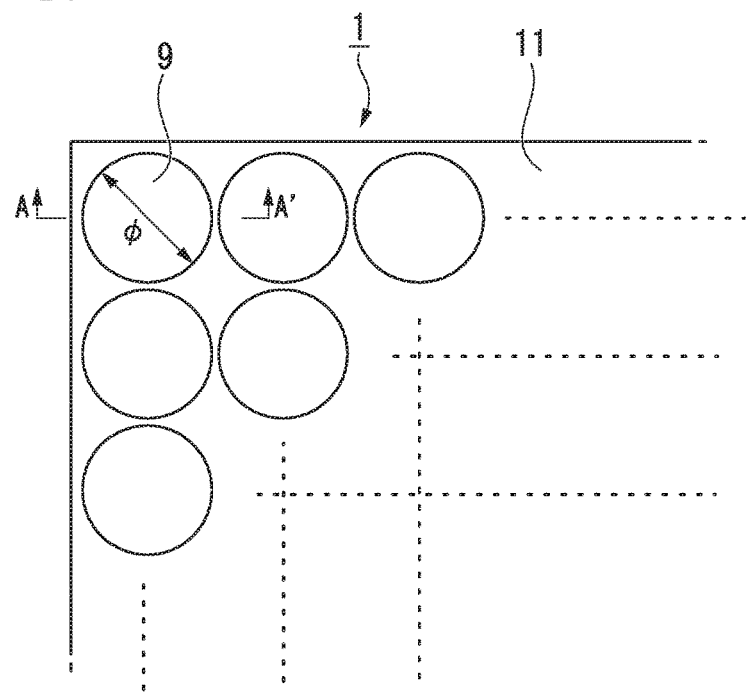
FIG. 2 is a plan view of an enlarged part of one unit light emitting area.

FIG. 2 is a plan view of an enlarged part of one unit light emitting area 11.

When viewed in a direction normal to the top surface of the organic EL device 1, the unit light emitting area 11 has a planar square shape, and the length of one side of the square is, for example, about 2 mm.

As shown in FIG. 2, a plurality of recesses 9 having a circular planar shape are provided in the unit light emitting area 11. The diameter y of the recess 9 is, for example, about 5 μm. The plurality of recesses 9 are disposed regularly in vertical and horizontal directions and form a grid. The density of the recesses 9 is about 70% that is a proportion of the total area of the plurality of recesses 9 with respect to the area of the unit light emitting area 11.

Figure 3:
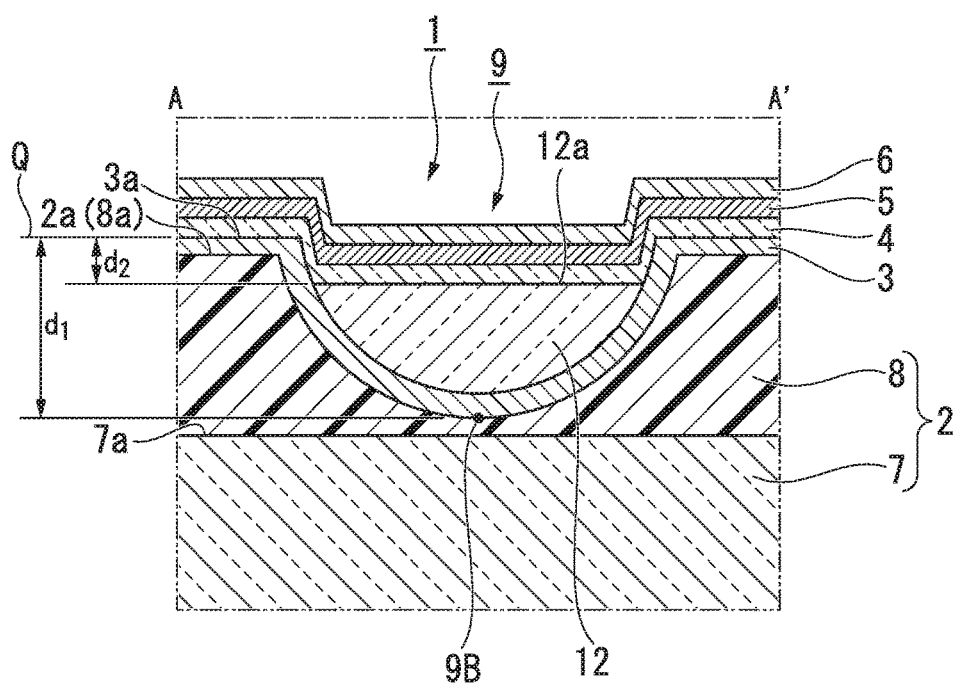
FIG. 3 is a cross-sectional view of an organic EL device taken along any plane perpendicular to a top surface of a base material.

FIG. 3 is a cross-sectional view of the organic EL device 1 taken along any plane perpendicular to a top surface of the base material 2, and is a cross-sectional view along the line A-A' in FIG. 2.

As shown in FIG. 3, the underlayer 8 is laminated on a top surface 7a of the substrate 7. As the substrate 7, for example, a glass substrate is used. Here, since the organic EL device 1 is a top emission type organic EL device, the substrate 7 does not necessarily have light transmissivity, and a semiconductor substrate, for example, a silicon substrate, may be used.

On a top surface 8a of the underlayer 8, that is, on a top surface 2a of the base material 2, the recesses 9 that open upward are provided. A cross-sectional shape of the recess 9 is an arc shape. That is, an inner surface of the recess 9 forms a part of a spherical surface in three dimensions.

The underlayer 8 is formed of a photosensitive resin, for example, an acrylic, epoxy, or polyimide resin. When a photosensitive resin is used as the material of the underlayer 8, this is suitable for a method of forming the recesses 9 to be described below. However, when a method other than the formation method to be described below is used, a constituent material of the underlayer 8 may not necessarily have photosensitivity.

The constituent material of the underlayer 8 may not be a resin, and an inorganic material may be used. While the base material 2 including the substrate 7 and the underlayer 8 is used in the present embodiment, it is not always necessary to use an underlayer and recesses may be formed in the substrate itself.

The reflective layer 3 is formed on the top surface 8a of the underlayer 8 including inner surfaces of the recesses 9. As a constituent material of the reflective layer 3, a highly reflective metal, for example, aluminum, or silver, is suitably used.

In the present embodiment, the reflective layer 3 is formed of, for example, an aluminum film having a film thickness of 100 nm.

The filling layer 12 is filled inside the recesses 9 with the reflective layer 3 therebetween.

A top surface 12a of the filling layer 12 is positioned lower than a plane Q including a top surface 3a of the reflective layer 3.

A height from the top surface 12a of the filling layer 12 to the top surface 3a of the reflective layer 3 is set as d2. In the present embodiment, the height d2 is, for example, 0.1 mm. Here, a height d1 from the lowermost portion 9B of the recess 9 to the top surface 3a of the reflective layer 3 is, for example, 3 μm.

The top surface 12a of the filling layer 12 is preferably positioned lower than the plane Q including the top surface 3a of the reflective layer 3. However, even if the top surface 12a of the filling layer 12 is at a highest position, the height thereof needs to be the same height as the plane Q. In other words, the filling layer 12 is formed to protrude upward no higher than the plane Q.

The filling layer 12 of the present embodiment has a refractive index of 1.6. As a material of the filling layer 12, an acrylic, epoxy, or polyimide resin material may be exemplified.

The first electrode 4 is formed over the top surface 12a of the filling layer 12 and the top surface 3a of the reflective layer 3. The first electrode 4 has a step at the edge of the recess 9. In the first electrode 4, a portion positioned on the top surface 8a of the underlayer 8 is in contact with a part of the reflective layer 3. At a position inside the recess 9, a bottom surface of the first electrode 4 is in contact with the top surface 12a of the filling layer 12. Therefore, the bottom surface of the first electrode 4 is positioned lower than the plane Q including the top surface 3a of the reflective layer 3.

The first electrode 4 is an electrode formed of a transparent conductive film of, for example, indium tin oxide (ITO) or indium zinc oxide (IZO), and has light transmissivity. In the present embodiment, the first electrode 4 is formed of, for example, an ITO film having a film thickness of 120 nm. The first electrode 4 functions as an anode for injecting holes into the organic layer 5.

The organic layer 5 is laminated along a top surface of the first electrode 4. The organic layer 5 has a step at the edge of the recess 9 in accordance with a shape of the first electrode 4. The organic layer 5 is a laminate formed of an organic material including a hole injecting layer, a hole transporting layer, a light emitting layer, an electron transporting layer and an electron injecting layer. A bottom surface of the organic layer 5 is positioned lower than the plane Q including the top surface 3a of the reflective layer 3. Detailed configurations and functions of the layers forming the organic layer 5 will be described below.

The second electrode 6 is laminated along a top surface of the organic layer 5. The second electrode 6 has a step at the edge of the recess 9 in accordance with a shape of the organic layer 5. The second electrode 6 is a translucent electrode formed of a thin metal film of, for example, silver, or a magnesium silver alloy. That is, the second electrode 6 has both light transmissivity and light reflectivity, and transmits a part of incident light and reflects the rest.

Here, the second electrode 6 of the present embodiment preferably has a light reflectivity and a light transmissivity as close to those of a transparent electrode as possible. Specifically, the second electrode 6 is formed to have a light transmissivity of 30% or more, and a light reflectance of 70% or less.

The second electrode 6 functions as a cathode for injecting electrons into the organic layer 5. In the second electrode 6, a metal having a low work function is suitably used. For example, Ag, Al, a magnesium alloy (such as MgAg), and an aluminum alloy (such as AlLi, AlCa, and AlMg) may be used. As shown in FIG. 12, the second electrode 6 in the present embodiment has a 2-layer structure of a laminated film including, for example, an MgAg alloy film (a metal layer) 22 having a film thickness of 1 nm and an Ag film (a metal layer) 26 having a film thickness of 10 nm. Here, a desired light reflectance is obtained by adjusting the film thickness of the Ag film. With a general film thickness, a reflectance of Ag is about 98%. Therefore, in the present embodiment, the MgAg alloy film 22 has a small film thickness at which a light reflectance is 70% or less.

Returning to FIG. 3, in the present embodiment, an area interposed between the first electrode 4 and the second electrode 6 forms a microcavity structure. Light emitted from a light emitting layer 16 is multiply reflected between the first electrode 4 and the second electrode 6. In this case, a specific wavelength component of light emitted from the light emitting layer 16 is strengthened. In addition, although not shown in FIG. 3, an optical adjustment layer called a cap layer is laminated on a top surface of the second electrode 6.

Figure 4:
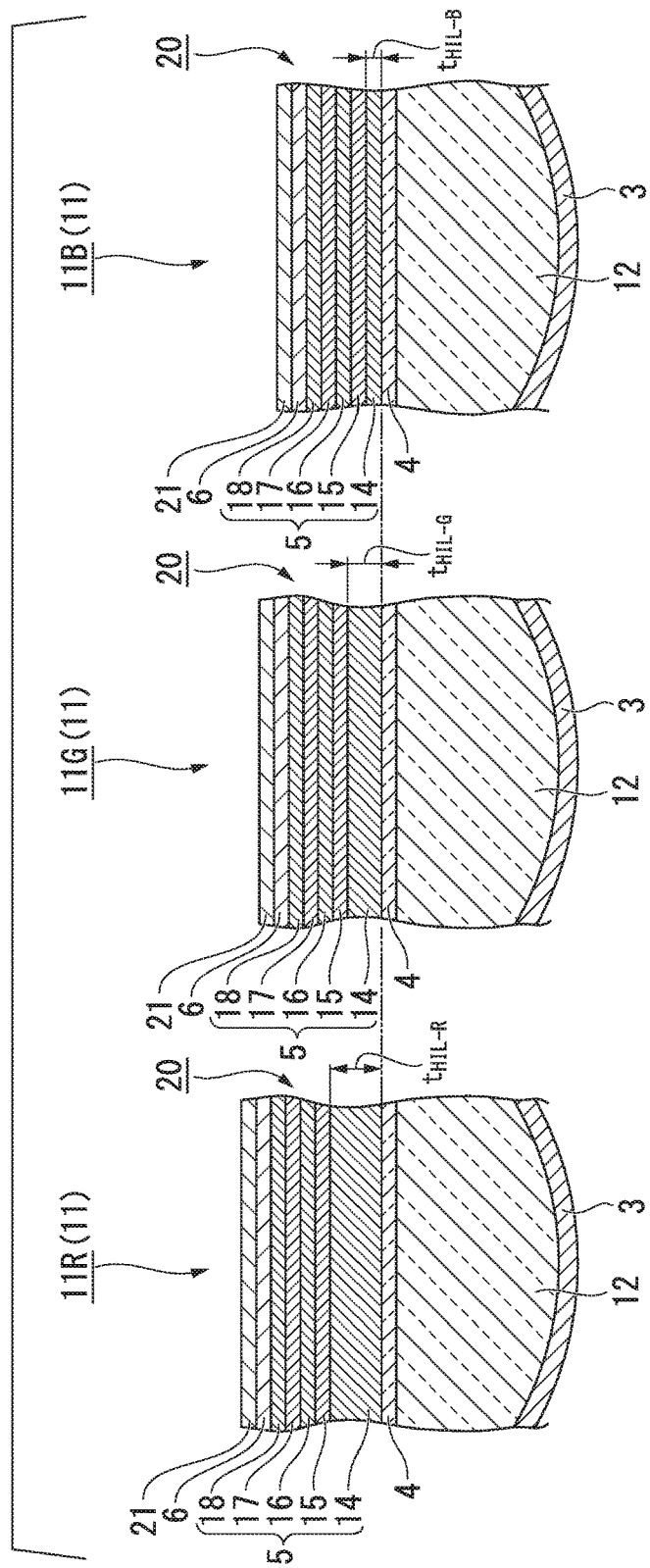
FIG. 4 shows cross-sectional views of detailed configurations of color unit light emitting areas.
Figure 5:
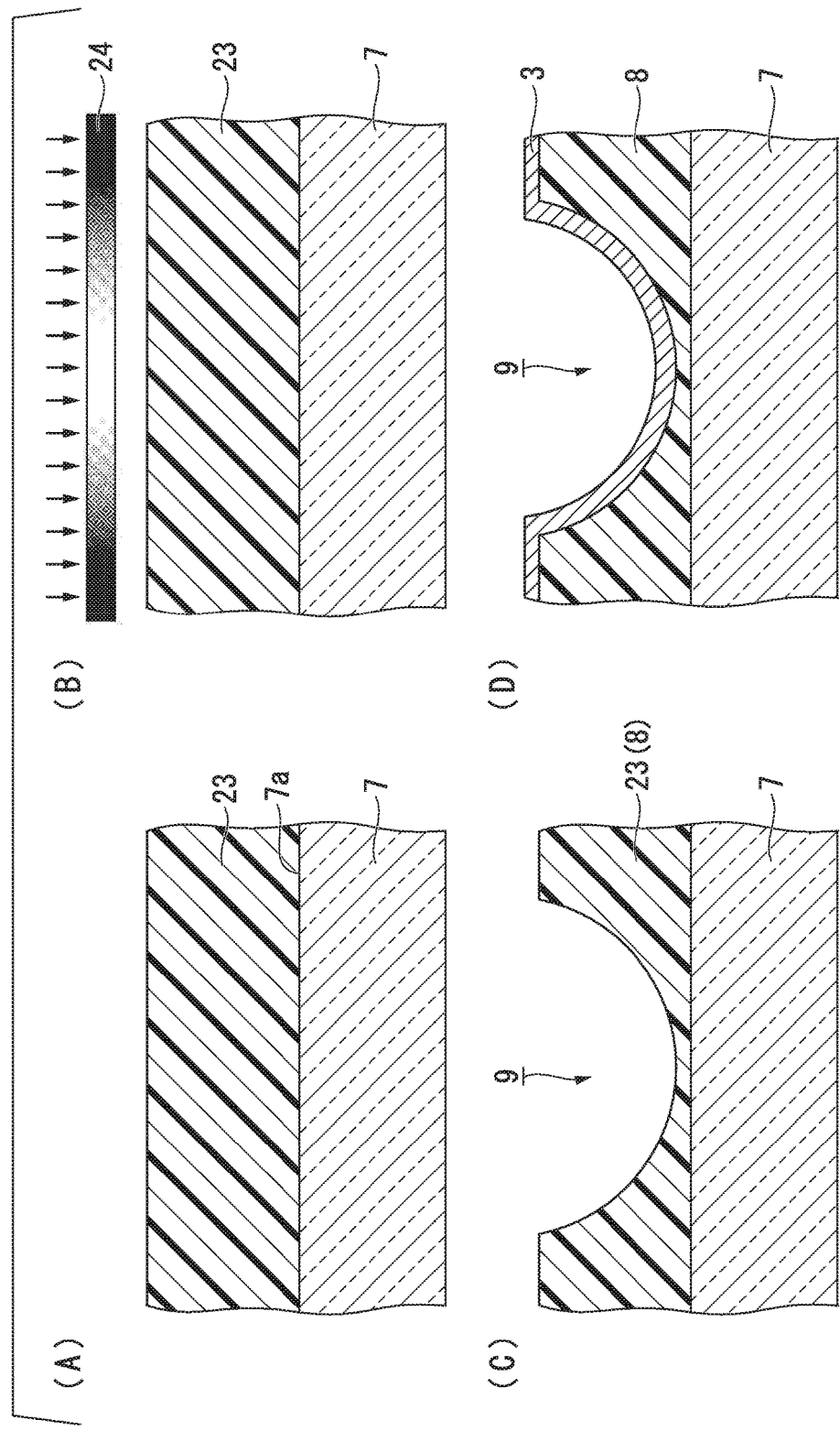
FIG. 5 is a cross-sectional view of a process of manufacturing an organic EL device according to a first embodiment.
Figure 6:
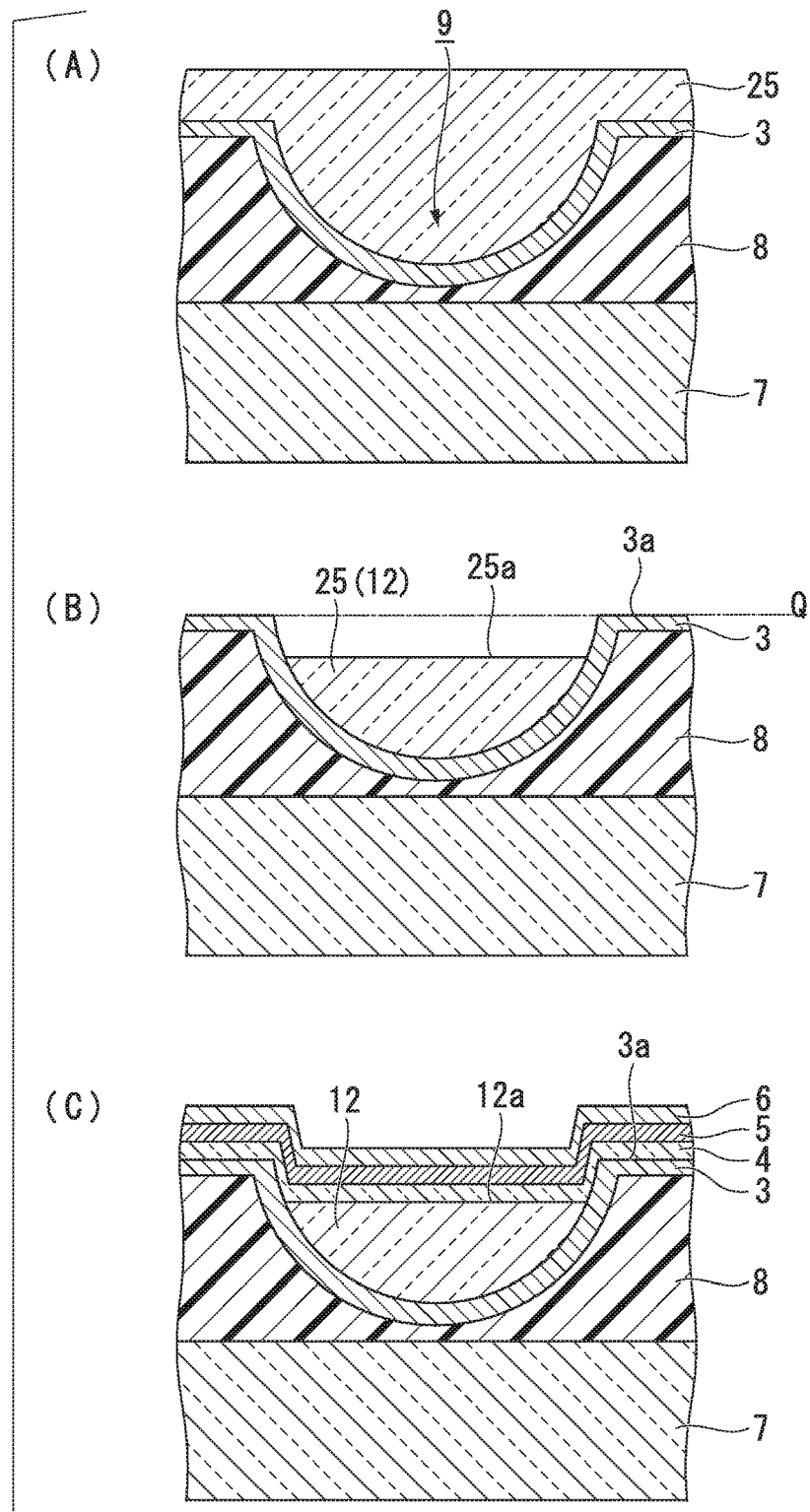
FIG. 6 is a cross-sectional view of a process of manufacturing the organic EL device according to the first embodiment.
Figure 7:
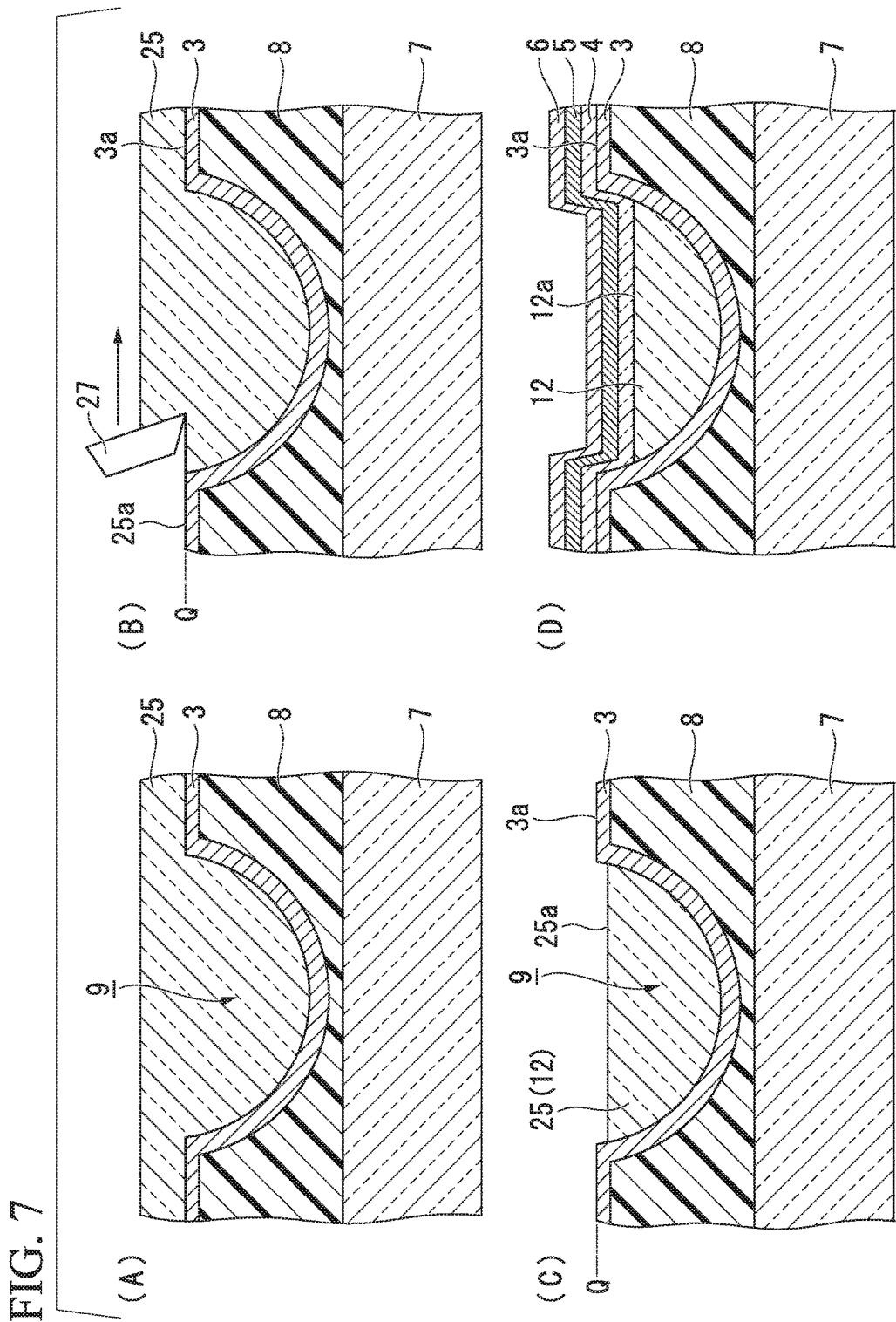
FIG. 7 is a cross-sectional view of a process of manufacturing the organic EL device according to the first embodiment.

FIG. 4 shows cross-sectional views of detailed configurations of color unit light emitting areas 11.

Three unit light emitting areas 11R, 11G, and 11B shown in FIG. 4 have the same basic configuration except that hole injecting layers 14 have different film thicknesses.

As shown in FIG. 4, the organic layer 5 is provided as a layer above the first electrode 4. The organic layer 5 is formed of a laminated film in which the hole injecting layer 14, a hole transporting layer 15, the light emitting layer 16, an electron transporting layer 17, and an electron injecting layer 18 are laminated from the first electrode 4. However, layers other than the light emitting layer 16 may be appropriately inserted as necessary. In addition, the hole transporting layer 15 and the hole injecting layer 14 may be integrated as one layer. In the present embodiment, as described above, an organic layer having a 5-layer structure of the hole injecting layer 14, the hole transporting layer 15, the light emitting layer 16, the electron transporting layer 17, and the electron injecting layer 18 is exemplified. In addition, as necessary, a layer for blocking movement of charges to an opposite electrode such as a hole blocking layer and an electron blocking layer may be appropriately added.

The hole injecting layer 14 is a layer having a function of increasing efficiency of hole injection from the first electrode 4 to the light emitting layer 16. As a material of the hole injecting layer 14, for example, benzine, styrylamine, triphenylamine, porphyrins, triazole, imidazole, oxadiazole, polyarylalkane, phenylenediamine, arylamine, oxazole, anthracene, fluorenone, hydrazone, stilbene, triphenylene, azatriphenylene, or derivatives thereof, or heterocyclic conjugated monomers, oligomers or polymers such as a polysilane compound, a vinylcarbazole compound, a thiophene compound or an aniline compound may be used and molybdenum oxide is mixed with such organic materials. A mixing ratio between the organic material and the molybdenum oxide, is for example, about 80% of the organic material to about 20% of molybdenum oxide.

The hole transporting layer 15 is a layer having a function of increasing efficiency of hole transport from the first electrode 4 to the light emitting layer 16. For the hole transporting layer 15, the same organic material as the hole injecting layer 14 is used. Here, the hole injecting layer 14 and the hole transporting layer 15 may be integrated or may be formed as independent layers.

The light emitting layer 16 has a function of recombining holes injected from the first electrode 4 and electrons injected from the second electrode 6 and emitting light using deactivation energy. A material of the light emitting layer 16 includes, for example, a host material and a dopant material. Moreover, an assist material may be included. The host material is included at the highest proportion among constituent materials in the light emitting layer 16. A mixing ratio between the host material and the dopant material is, for example, about 90% of the host material to about 10% of the dopant material. The host material has a function of facilitating film formation of the light emitting layer 16 and maintaining the light emitting layer 16 in a film state. Therefore, as the host material, a stable compound in which hardly any crystallization occurs after film formation and hardly any chemical change occurs is necessary. In addition, the light emitting layer 16 has a function of recombining carriers in host molecules, transferring excitation energy to the dopant material, and causing the dopant material to emit light when an electric field is applied between the first electrode 4 and the second electrode 6. The thickness of the light emitting layer 16 is, for example, about 60 nm.

As a specific material of the light emitting layer 16, a material including a substance having a high luminous efficiency such as a low-molecular-weight fluorescent dye, a fluorescent polymer, and a metal complex may be exemplified. As a material of the light emitting layer 16, for example, anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or derivatives thereof, tris(8-quinolinolato)aluminum complex, bis(benzoquinolinolato)beryllium complex, tri(dibenzoylmethyl)phenanthroline europium complex, and ditolyl vinyl biphenyl may be exemplified.

The electron transporting layer 17 has a function of increasing efficiency of electron transport from the second electrode 6 to the light emitting layer 16. As a material of the electron transporting layer 17, for example, quinoline, perylene, phenanthroline, bisstyryl, pyrazine, triazole, oxazole, oxadiazole, fluorenone or derivatives thereof, and a metal complex may be used. Specifically, tris(8-hydroxyquinoline)aluminum, anthracene, naphthalene, phenanthrene, pyrene, anthracene, perylene, butadiene, coumarin, acridine, stilbene, 1,10-phenanthroline or derivatives thereof, and a metal complex may be used. The thickness of the electron transporting layer 17 is, for example, about 15 nm.

The electron injecting layer 18 has a function of increasing efficiency of electron injection from the second electrode 6 to the light emitting layer 16. As a material of the electron injecting layer 18, for example, calcium (Ca) metal or lithium fluoride (LiF) may be exemplified. Here, the electron transporting layer 17 and the electron injecting layer 18 may be integrated or may be formed as independent layers. The thickness of the electron injecting layer 18 is, for example, about 0.5 nm.

A microcavity structure 20 has an effect of enhancing light of a specific wavelength using resonance of light generated between the first electrode 4 and the second electrode 6. In the present embodiment, wavelengths of light emitted from the red, green, and blue unit light emitting areas 11R, 11G, and 11B are different from each other. Therefore, an optical path length between the first electrode 4 and the second electrode 6 corresponds to a peak wavelength of an emission spectrum of each color. Optical path lengths are set so that an optical path length of the red unit light emitting area 11R is the longest, an optical path length of the blue unit light emitting area 11B is the shortest, and an optical path length of the green unit light emitting area 11G has an intermediate length.

There are various methods for setting optical path lengths of the microcavity structure 20 of the unit light emitting areas 11R, 11G, and 11B to be different from each other. Here, in consideration of minimizing an influence on a resistance value, a method of setting the thickness of the hole injecting layer 14 to be different is used. When a thickness of the hole injecting layer 14 of the red unit light emitting area 11R is set as tHIL-R, a layer thickness of the hole injecting layer 14 of the green unit light emitting area 11G is set as tHIL-G, and a layer thickness of the hole injecting layer 14 of the blue unit light emitting area 11B is set as tHIL-B, tHIL-R>tHIL-G>tHIL-B is satisfied.

According to the microcavity structure 20, light emitted from the organic layer 5 is repeatedly reflected within a range of a predetermined optical length between the first electrode 4 and the second electrode 6, light of a specific wavelength corresponding to the optical path length is resonated and enhanced, but light of a wavelength that does not correspond to the optical path length is weakened. As a result, a spectrum of light extracted to the outside is sharp and has a high intensity, and luminance and color purity are improved.

As a constituent material of the light emitting layer 16, a light emitting material that emits red light may be used in the red unit light emitting area 11R, a light emitting material that emits green light may be used in the green unit light emitting area 11G, and a light emitting material that emits blue light may be used in the blue unit light emitting area 11B. In the present embodiment, in all of the unit light emitting areas, a bipolar material is used as the host material.

As the dopant material, a phosphorescent material is used for the red unit light emitting area 11R and the green unit light emitting area 11G, and a fluorescent material is used for the blue unit light emitting area 11B. The thickness of the light emitting layer 16 is, for example, about 60 nm, in the red unit light emitting area 11R and the green unit light emitting area 11G, and is, for example, about 35 nm, in the blue unit light emitting area 11B.

Since the present embodiment has a feature for enabling the second electrode 6 to have transparency, the degree of a microcavity effect using reflected light of the second electrode 6 is low. However, even in the second electrode 6 and a cap layer 54 in contact with an air layer laminated on the second electrode 6, a considerable amount of surface reflection occurs due to a refractive index difference. Therefore, it is possible to exhibit a microcavity effect although it is weak.

Of course, when transparency of the second electrode 6 increases, the microcavity effect also becomes weaker. In that case, the film thickness of the hole injecting layer 14 can be the same in RGB.

Alternatively, the same light emitting material that emits white light may be used in all of the red unit light emitting area 11R, the green unit light emitting area 11G, and the blue unit light emitting area 11B. In this case also, light of a different wavelength is resonated and amplified in each of the unit light emitting areas 11R, 11G, and 11B. As a result, red light is emitted from the red unit light emitting area 11R, green light is emitted from the green unit light emitting area 11G, and blue light is emitted from the blue unit light emitting area 11B.

A cap layer 21 is laminated on the top surface of the second electrode 6. The cap layer 21 functions as a protective layer for protecting the second electrode 6 and functions as an optical adjustment layer. Also, a color filter may be added to an upper layer side of the second electrode 6. Light emitted from the organic layer 5 passes through the color filter, and thus color purity can increase.

Specific configuration examples of the organic EL device 1 are shown, for example, in [Table 1].

TABLE 1

| | Red | Green | Blue |
|---|---|---|---|
| Anode: ITO | 120 nm | 120 nm | 120 nm |
| Hole injecting layer (HIL) Organic HTL material (80%): MoOx (20%) | 130 nm | 70 nm | 35 nm |
| Hole transporting layer: organic ETL material | 10 nm | 10 nm | 10 nm |
| Light emitting layer (EML) | H (90%):d (10%) 60 nm H: bipolar material d: phosphorescent material | H (90%):d (10%) 60 nm H: bipolar material d: phosphorescent material | H (90%):d (10%) 35 nm H: bipolar material d: fluorescent material |
| Electron transporting layer: organic ETL material | 15 nm | 15 nm | 15 nm |
| Electron injecting layer: LiF | 0.5 nm | 0.5 nm | 0.5 nm |
| Cathode (translucent electrode) | MgAg 1 nm/Ag | MgAg 1 nm/Ag | MgAg 1 nm/Ag |

A process of manufacturing the organic EL device 1 having the above configuration will be described below with reference to FIG. 5 to FIG. 8.

First, as shown in FIG. 5A, a positive photosensitive resin material is applied to the top surface 7a of the substrate 7 to form a resin layer 23.

Next, as shown in FIG. 5B, the resin layer 23 is exposed through a photomask 24.

In this case, like a gray tone mask, the photomask 24 having a predetermined light transmission amount distribution, specifically, the photomask 24 whose light transmission amount near the center of a circular pattern is large and whose light transmission amount reduces toward the peripheral portions is used. Accordingly, in the resin layer 23, an exposure amount near the center of a circular pattern is large and an exposure amount reduces toward the peripheral portions.

Next, as shown in FIG. 5C, a predetermined developing solution is used to develop the resin layer 23. In this case, according to differences in the exposure amount of the resin layer 23, a film reduction amount of the resin layer 23 is large near the center of a circular pattern and reduces toward the peripheral portions. In this manner, the recesses 9 whose cross-sectional shapes are arc shapes are formed in the resin layer 23 and the underlayer 8 is formed.

Next, as shown in FIG. 5D, a metal such as aluminum is deposited on the entire surface of the underlayer 8 and the reflective layer 3 is formed.

Next, as a method of forming the filling layer 12, three methods may be exemplified.

Methods of forming the filling layer 12 will be described below.

The first filling layer formation method is as follows.

First, as shown in FIG. 6A, an acrylic, epoxy, or polyimide resin film 25 is formed on the entire surface of the reflective layer 3. As a method of forming the resin film 25, for example, a spin coating method, a bar coating method or the like is used, and a liquid resin material is applied onto the reflective layer 3. In this case, the film thickness of the resin film 25 is set so that the resin film 25 fills the recess 9 and also covers a flat portion of the reflective layer 3.

Next, as shown in FIG. 6B, the entire surface of the resin film 25 is etched back using, for example, a plasma ashing (dry ashing) method. In this case, an amount of etch back is adjusted so that a top surface 25a of the resin film 25 is positioned lower than the plane Q including the top surface 3a of the reflective layer 3. Accordingly, the filling layer 12 is formed.

Next, as shown in FIG. 6C, on the top surface 3a of the reflective layer 3 and the top surface 12a of the filling layer 12, the first electrode 4, the organic layer 5, and the second electrode 6 are sequentially formed. The first electrode 4, the organic layer 5, and the second electrode 6 are formed according to a known process. For example, a pattern may be formed according to a vacuum deposition method using a shadow mask. The method is not limited thereto, and a spray method, an ink jet method, a printing method, a laser transfer method, and the like can be used.

The second filling layer formation method is as follows.

As shown in FIG. 7A, the acrylic, epoxy, or polyimide resin film 25 is formed on the entire surface of the reflective layer 3. This process is the same as in the first filling layer formation method shown in FIG. 6A.

Next, as shown in FIG. 7B, a squeegee 27 is used to planarize the entire surface of the resin film 25. In this case, the squeegee 27 is moved along the top surface 3a of the reflective layer 3 so that the top surface 25a of the resin film 25 after the squeegee 27 has passed is on the same plane as the plane Q including the top surface 3a of the reflective layer 3.

Next, as shown in FIG. 7C, a base material in which the resin film 25 remains in the recess 9 is calcined.

A volume of the resin film 25 is reduced due to calcination. As a result, the top surface 25a of the resin film 25 is positioned lower than the plane Q including the top surface 3a of the reflective layer 3. Accordingly, the filling layer 12 is formed.

Next, as shown in FIG. 7D, on the top surface 3a of the reflective layer 3 and the top surface 12a of the filling layer 12, the first electrode 4, the organic layer 5, and the second electrode 6 are sequentially formed. This process is the same as in the first filling layer formation method shown in FIG. 6C.

The third filling layer formation method is as follows.

As shown in FIG. 8(A), the acrylic, epoxy, or polyimide resin film 25 is laminated on a surface of the reflective layer 3 corresponding to the inside of the recess 9. As a method of forming the resin film 25, a droplet resin material is applied onto the reflective layer 3 using, for example, an inkjet method. In this case, an amount of a resin material discharged from an inkjet head 29 is adjusted so that the top surface 25a of the resin film 25 is positioned lower than the plane Q including the top surface 3a of the reflective layer 3. Accordingly, the filling layer 12 is formed.

Next, as shown in FIG. 8(B), on the top surface 3a of the reflective layer 3 and the top surface 12a of the filling layer 12, the first electrode 4, the organic layer 5, and the second electrode 6 are sequentially formed. This process is the same as in the first filling layer formation method shown in FIG. 6C.

The organic EL device 1 of the present embodiment is completed according to the above processes.

FIG. 9(A) is a cross-sectional view showing an organic EL device 101 having no recess structure in the related art.

The organic EL device 101 has a configuration in which a reflective layer 103, a first electrode 104, an organic layer 105, and a second electrode 106 are sequentially laminated on a substrate 102. In the organic EL device 101, light emitted from a light emitting layer in the organic layer 105 is uniformly emitted in all directions, and travels inside while being refracted at the interface between layers having different refractive indexes. Light having traveled toward the substrate 102 is reflected at the reflective layer 103.

Since there is a refractive index difference at the interface between the second electrode 106 and an external space (air), light incident at a small angle of incidence with respect to the interface is emitted to the external space, and light incident at a large angle of incidence is reflected at the interface and travels inside again. For example, light L1 emitted from an arbitrary light-emitting point M in the organic layer 105 in a direction close to horizontal is refracted at the interface between layers, and hardly any thereof is emitted to the external space even if an angle slightly changes.

In a path when light travels in the organic EL device 101, at the interface between the second electrode 106 and the external space (air), a loss due to light reflection does not occur. On the other hand, at the interface between the first electrode 104 and the reflective layer 103, in general, since a reflectance of a metal of the reflective layer 103 is not 100%, a loss due to light reflection occurs. Further, some light is absorbed by each film while travelling in the organic EL device 101. Therefore, light attenuates while traveling in the organic EL device 101. In general, a refractive index of the organic layer 105 is about 1.8. In this case, in light emitted from the light emitting layer, a proportion of light extracted to the external space is about 20%. As a result, the organic EL device 101 of the related art has a problem of low light use efficiency.

On the other hand, in the organic EL device 1 of the present embodiment, as shown in FIG. 9(B), since the reflective layer 3 is curved along the recess 9, light reflected at the reflective layer 3 has a travelling direction that is changed and travels in the organic EL device 1. In this case, even if light originally has a large angle of incidence with respect to the interface between the second electrode 6 and the external space (air), light is reflected at the reflective layer 3 and thus has an angle of incidence that is smaller than a critical angle at the interface between the second electrode 6 and the external space, and the light is extracted to the external space.

In particular, in the present embodiment, as described above, the top surface 12a of the filling layer 12 is positioned lower than the plane Q including the top surface 3a of the reflective layer 3 and a bottom surface 5b of the organic layer 5 is positioned lower than the plane Q. That is, the reflective layer 3 is provided on the side (in the horizontal direction in FIG. 9(B)) of the organic layer 5 inside the recess 9. Therefore, for example, light L1 emitted from an arbitrary light-emitting point M in the organic layer 5 in a direction close to horizontal is reflected at the reflective layer 3 and has an angle in the travelling direction that is changed.

As a result, unlike the organic EL device 101 of the related art shown in FIG. 9(A), light L1 emitted from the light-emitting point M in a direction close to horizontal is reflected at the reflective layer 3, and then can be extracted to the external space when the light L1 enters at an angle of incidence smaller than a critical angle at the interface between the second electrode 6 and the external space. In this manner, it is possible to provide the organic EL device 1 having excellent light use efficiency.

Moreover, in the present embodiment, since the top surface 12a of the filling layer 12 is positioned lower than the plane Q and the bottom surface 5b of the organic layer 5 is positioned lower than the plane Q, light emitted substantially horizontally from the light-emitting point M in the organic layer 5 can also enter the reflective layer 3. However, if the top surface 12a of the filling layer 12 is on the same plane as the plane Q, the bottom surface 5b of the organic layer 5 is positioned higher than the plane Q. In this case, since the reflective layer 3 is not provided on the side of the organic layer 5 positioned inside the recess 9, light emitted substantially horizontally from the light-emitting point M in the organic layer 5 does not enter the reflective layer 3.

Here, compared to the organic EL device 101 of the related art, a proportion of light emitted from the light-emitting point M in the organic layer 5 within a predetermined angle range close to the side that enters the reflective layer 3 sufficiently increases. Therefore, in such a configuration, it is possible to provide the organic EL device 1 having excellent light use efficiency.

Furthermore, in addition to the light extraction structure described above, as a feature for the organic EL device 1 in the present embodiment, the second electrode 6 close to a transparent electrode is included. In a configuration of the related art, when a light reflectance of the second electrode is high, light that should be extracted to the outside is reflected at the second electrode and enters the recess structure again.

FIG. 10(A) is a diagram showing an example of a light component emitted to a front surface within a light emitting component. FIG. 10(B) is a diagram showing an example of a process in which a light component emitted to a front surface is totally reflected at the second electrode 6 and enters a recess structure again.

As shown in FIG. 10(A), during light emission at the arbitrary light-emitting point M of the organic layer 5, light emitted downward at a certain angle from the light-emitting point M has an angle that is changed when it is reflected at the reflective layer 3 twice and the light is changed to light L1 emitted in the forward direction. When a light reflectance of the second electrode 6 is low, the light L1 passes through the second electrode 6 and is emitted and extracted to the outside.

As shown in FIG. 10(B), on the other hand, when a light reflectance of the second electrode 6 is high, light emitted from the light-emitting point M is reflected at the reflective layer 3 and then also reflected at the second electrode 6. Light L2 reflected at the second electrode 6 enters the recess structure again. Then, the light has an angle that is changed due to reflection at the reflective layer 3 again and reaches the second electrode 6. Here, since a travelling direction of the light L2 is changed in the recess structure, when the light reaches the second electrode 6 again, there is no light emitted in the forward direction.

Furthermore, some of the light L2 reaching the second electrode 6 is reflected at the second electrode 6 again. The light L3 has an angle that is changed due to reflection at the reflective layer 3 and is emitted from the second electrode 6 in a direction different from that of the front surface. As a result, a light component emitted in the forward direction due to reflection at the second electrode 6 is reduced in magnitude, which results in a reduction in forward luminance.

For this reason, when a light reflectance of the second electrode 6 is minimized, it is possible to efficiently extract light emitted in the forward direction.

In order to verify an effect of the organic EL device 1 of the present embodiment, the inventors produced a plurality of organic EL devices in which a film thickness of the second electrode 6 was adjusted to change a light reflectance and compared light extraction efficiencies in the forward direction. Here, a green light emitting element was provided in all examples.

FIG. 11 is a graph showing a comparison between a light reflectance of a second electrode and a relative intensity. In the drawing, the horizontal axis represents a light reflectance [%] of the second electrode and the vertical axis represents a relative intensity when a luminance of the green light emitting element was set to 1.

As shown in FIG. 11, it can be understood that, when the film thickness of the second electrode 6 decreases and thus a light reflectance decreases, light extraction efficiency of the organic EL device 1 of the present embodiment is improved.

Here, it can be understood that, when a light reflectance of the second electrode 6 is 80% or more, a relative luminance intensity is lower than that of the structure having no recess structure in the related art.

In addition, the inventors performed an investigation by changing the shape of the recesses in addition to the shape of the recess structure of the present embodiment described above. As a result, it was found that, when a light reflectance of the second electrode 6 is 70% or less, the relative luminance intensity is 1 or more, and an effect according to the recess structure can be exhibited.

Of course, although it is favorable to increase transparency of the second electrode 6 as much as possible, when the film thickness of the electrode is too small, the electrode may be disconnected due to the unevenness of the device. In addition, since the resistance value of the electrode also increases, it is desirable that the film thickness of the second electrode 6 be set to be an optimal transmittance depending on conditions of a device that is used.

As described above, according to the present example, it is possible to increase a light transmittance by reducing a light reflectance of the second electrode 6. Accordingly, light emitted in the forward direction from an arbitrary light-emitting point in the organic layer 5 can be extracted to the outside without being reflected at the second electrode 6. As a result, it is possible to efficiently increase the forward luminance.

Second Embodiment

Next, an organic EL device according to a second embodiment of the present invention will be described.

The basic configuration of the organic EL device according to the present embodiment to be described below is substantially the same as that of the first embodiment except that a transparent conductive film is further included as a component of the second electrode. Therefore, in the following description, different parts will be described in detail, but common parts will not be described. In addition, in the drawings used for description, the same reference numerals denote elements the same as in FIG. 1 to FIG. 12.

FIG. 13 is a cross-sectional view showing a structure of a second electrode in an organic EL device according to the second embodiment.

The organic EL device in the present embodiment includes a second electrode 19 having a 3-layer structure as shown in FIG. 13. The second electrode 19 has a configuration in which a transparent conductive film is laminated on a 2-layer metal film including, for example, Ag, Al, a magnesium alloy (such as MgAg), and an aluminum alloy (such as AlLi, AlCa, and AlMg). The transparent conductive film functions as a protective layer of a metal film.

The second electrode 19 of the present embodiment has a 3-layer structure of a laminated film including, for example, the MgAg alloy film 22 having a film thickness of 1 nm, the Ag film 26 having a film thickness of 10 nm, and an ITO film (a transparent conductive film) 28 having a film thickness of 100 nm. The Ag film 26 of the present embodiment has a smaller film thickness than the Ag film in the first embodiment.

In the present embodiment, film thicknesses are adjusted so that a light reflectance in the laminated structure of the MgAg alloy film 22 and the Ag film 26 within the second electrode 19 is 50%. The ITO film 28 is formed according to an ion plating method and has a light transmittance of 90%. The ion plating method is a film formation method in which damage to an organic layer is small.

Here, comparisons between optical properties of the organic EL device in the first embodiment and the organic EL device in the second embodiment are shown, for example, in [Table 2].

TABLE 2

| | Reflectance of second electrode | Forward luminance at TE luminance ratio |
|---|---|---|
| First embodiment | 70% | 130% |
| Second embodiment | 55% | 150% |

The present embodiment has a structure in which a reflectance in the second electrode 19 is minimized. That is, since the film thickness of the Ag film 26 of the second electrode 19 is smaller than that of the first embodiment, the organic EL device of the present embodiment has a more improved luminance in the forward direction than the organic EL device of the first embodiment. Moreover, in the present embodiment, while the film thickness of the Ag film 26 is smaller than that of the first embodiment, when the ITO film 28 is formed on the Ag film 26, no disconnection occurs.

As described above, the higher the light transmittance of the second electrode 19, the stronger the effect of efficiently extracting light from the inside of the recess structure. On the other hand, when the film thickness of the second electrode 19 is too small, there is a risk of disconnection. Therefore, when the film thickness of the Ag film 26 constituting the second electrode 19 is reduced to be as thin as possible and the ITO film 28 serving as a transparent conductive film is formed thereon, it is possible to ensure conductivity while the light reflectance is reduced. In consideration of an effect of injecting electrons into the electron transporting layer 17, it is difficult to form the second electrode 19 only with the ITO film 28. This is because ITO has low electron injectability and the light emitting layer 16 hardly emits light. Therefore, as a component of the second electrode 19, not only the ITO film 28 but also the metal laminated film of the MgAg alloy film 22 and the Ag film 26 are necessary.

Third Embodiment

Next, an organic EL device according to a third embodiment of the present invention will be described.

The basic configuration of the organic EL device of the present embodiment to be described below is substantially the same as that of the first embodiment except that structures of a second electrode and an organic layer are different. Therefore, in the following description, different parts will be described in detail, but common parts will not be described. In addition, in the drawings used for description, the same reference numerals denote elements the same as in FIG. 1 to FIG. 12.

FIG. 14 is a diagram showing a difference of structures of second electrodes and light emitting layers between the organic EL device (the right drawing) of the third embodiment and the organic EL device of the first embodiment (the left drawing).

As shown on the right in FIG. 14, the organic EL device in the present embodiment includes a second electrode 30 including only ITO, an organic layer 35 and the first electrode 4.

The organic layer 35 includes a laminated film in which the hole injecting layer 14, the hole transporting layer 15, the light emitting layer 16, and an electron transporting layer (a doping layer 31) are laminated from the first electrode 4. The electron transporting layer of the present embodiment also has an electron injection function.

Similarly to the second embodiment, the second electrode 30 is made of an ITO film formed according to an ion plating method. The second electrode 30 has a film thickness of 100 nm and a light transmittance of 90%. Here, a metal material is not used in the second electrode 30.

In the present embodiment, as an electron transporting layer (ETL), an n-type electron transporting layer (n-ETL) obtained by doping an electron transporting material (ETM) with about 10% of cesium carbonate ($CsCO_3$) is provided.

In the following description, the n-type electron transporting layer (n-ETL) will be simply referred to as the doping layer 31. The doping layer 31 is formed by co-depositing an electron transporting material and $CsCO_3$ and has a film thickness of 100 nm.

Note that a material with which an electron transporting material is doped is not limited to $CsCO_3$ described above. For example, an oxide such as $TiO_2$, $WO_3$, and LiO, CNT, fullerenes, and a carbon material may be used and kinds thereof are not limited.

As shown on the left in FIG. 14, in the above-described organic EL device of the first embodiment, as a structure for injecting electrons from the cathode laminated on the light emitting layer 16, the second electrode 6 including a metal layer into which electrons are easily injected, the electron injecting layer 18, and the electron transporting layer (ETL) 17 having high electron transportability are provided. Since the organic layer 5 does not include free electrons, it is necessary to inject electrons from the electrode.

On the other hand, the organic EL device of the present embodiment includes the doping layer 31 in which charges inherent in the electron transporting layer 17 are incorporated by doping an electron transporting layer material with nitrogen. Since electrons can be injected into the light emitting layer 16 through the doping layer 31, there is no need to separately provide the electron injecting layer 18.

In addition, since electricity flows more easily by one to three orders of magnitude, it is possible to increase the film thickness further than in the electron transporting layer 17 including only an organic material. In addition, when an ITO film is directly formed on the organic layer 35, the organic layer 35 is damaged and characteristics deteriorate. In particular, damage to the light emitting layer 16 is great.

In the present embodiment, a configuration in which the ITO film is not directly provided on the light emitting layer 16, but the second electrode 30 is laminated thereon with the doping layer 31 therebetween is used. In addition, since the electron injecting layer 18 is unnecessary and thus the film thickness of the doping layer 31 can be increased, the light emitting layer 16 is not damaged when the ITO film is formed.

Here, while the organic layer 35 of the present embodiment has a configuration in which the doping layer 31 is laminated on the light emitting layer 16, the present invention is not limited thereto. For example, the electron transporting layer 17 and the doping layer 31 may be laminated on the light emitting layer 16 in that order.

Moreover, in the present embodiment, no metal material is used for the second electrode 30. When the second electrode 30 includes only ITO being transparent and having conductivity, the light transmittance is higher than that of the second electrodes 6 of the embodiments described above. Therefore, it is possible to obtain an organic EL device whose light extraction efficiency is further improved.

Here, comparisons between optical properties of the organic EL devices according to the first to third embodiments are shown in, for example, [Table 3]. Here, the light transmittance of the second electrode 30 according to the third embodiment is set to about 85%.

TABLE 3

|  | Reflectance of second electrode | Forward luminance at TE luminance ratio |
| --- | --- | --- |
| First embodiment | 70% | 130% |
| Second embodiment | 55% | 150% |
| Third embodiment | 0% (transmittance 85%) | 170% |

As shown in Table 3, it can be understood that, in the organic EL device of the third embodiment, since hardly any light is reflected at the second electrode 30, an effect according to the recess structure for light extraction efficiency is sufficiently exhibited. Since the light transmittance of the second electrode 30 is about 85%, a light component bent in the forward direction in the recess structure and emitted is less likely to be reflected at the second electrode 30 and passes through the second electrode 30 without change. As a result, it is possible to exhibit an effect according to the recess structure.

In addition, when the thick doping layer 31 is laminated, no damage to the light emitting layer 16 occurs when the second electrode 30 made of an ITO film is formed and high forward luminance is obtained.

Fourth Embodiment

Next, an organic EL device according to a fourth embodiment of the present invention will be described.

The basic configuration of the organic EL device of the present embodiment to be described below is substantially the same as that of the first embodiment except that a second electrode includes an ITO film and an auxiliary electrode. Therefore, in the following description, different parts will be described in detail, but common parts will not be described. In addition, in the drawings used for description, the same reference numerals denote elements the same as in FIG. 1 to FIG. 12.

FIG. 15 is a top surface view showing auxiliary electrodes of the second electrode of the organic EL device according to the fourth embodiment. FIG. 16 is a cross-sectional view showing a configuration of the second electrode.

As shown in FIG. 15, the organic EL device of the present embodiment is a device having one side of a pixel area, which as a length L of 15 cm, and a large pixel size. The organic EL device includes a second electrode 43 that has an ITO film 41 and an auxiliary electrode 42.

The ITO film 41 is formed in the entire pixel area according to an ion plating method and has a film thickness of 100 nm.

As shown in FIG. 15 and FIG. 16, the auxiliary electrode 42 includes a plurality of first auxiliary electrode parts 42A and a plurality of second auxiliary electrode parts 42B. As a material of the auxiliary electrode 42, a metal material such as aluminum may be exemplified. The plurality of first auxiliary electrode parts 42A and the plurality of second auxiliary electrode parts 42B extend in crossing directions and form a grid as a whole.

Specifically, the plurality of first auxiliary electrode parts 42A extend in one direction (Y direction) in the pixel area and are disposed in parallel at predetermined intervals in a direction (X direction) crossing the extending direction. The plurality of second auxiliary electrode parts 42B extends in the other direction (X direction) in the pixel area and are disposed in parallel at predetermined intervals in a direction (Y direction) crossing the extending direction.

As an exemplary size of the auxiliary electrode 42, the auxiliary electrode 42 may have a width W of 300 nm, a height H of 500 nm and a pitch P of 15 mm, as shown in FIG. 16. While the auxiliary electrode 42 may be formed by depositing a pattern using a metal material such as Al through a metal mask, the formation method is not limited thereto.

In the present embodiment, after the auxiliary electrode 42 is formed, when the auxiliary electrode 42 is covered to form the ITO film 41, the second electrode 43 is formed. However, the present invention is not limited thereto. Alternatively, after the ITO film 41 is formed on the organic layer 5, the auxiliary electrode 42 may be formed on the ITO film 41.

When the pixel size increases, in the second electrode including only the ITO film as shown in the third embodiment, the voltage drop is bigger due to the resistivity relationship. As a result, it is difficult for all pixels to uniformly emit light.

On the other hand, in the organic EL device of the present embodiment, since the ITO film 41 made of ITO and the auxiliary electrode 42 come in contact at an end of the recess structure, even if the pixel size increases, resistivity in the auxiliary electrode 42 is low. Accordingly, the occurrence of a voltage drop is prevented and it is possible for all pixels to uniformly emit light.

In order to verify an effect of the organic EL device of the above-described present embodiment, the inventors produced the organic EL device of the above-described third embodiment and the organic EL device of the fourth embodiment and compared light emission states of both devices.

Here, a voltage was applied from one side to 15 cm square of pixels.

In the organic EL device of the third embodiment, the result was that pixels shone brightly on one side to which an electric field was applied, and became darker when they were farther away therefrom, and hardly any light shone near the opposite side.

On the other hand, in the organic EL device of the present embodiment, light was uniformly emitted in all pixels.

According to the organic EL device of the present embodiment, when the auxiliary electrode 42 is provided, a resistance value of the second electrode 43 is lowered and all pixels can uniformly emit light. Such a configuration can be applied to not only a structure having a large pixel size as in the present embodiment but also a structure of a collection of fine pixels such as a display.

That is, the first electrode 4 on the anode side of fine pixels can compensate for the resistivity of the electrode using a metal wiring or the like. On the other hand, since the second electrode 43 on the anode side is formed on the entire surface of the pixel area, the resistivity of the electrode may be problematic depending on the size of the display. Even in such a case, when a configuration including the auxiliary electrode 42 as in the present embodiment is used, it is possible to produce a uniform light emitting display.

Fifth Embodiment

Next, an organic EL device according to a fifth embodiment of the present invention will be described.

The basic configuration of the organic EL device of the present embodiment to be described below is substantially the same as that of the first embodiment except that a plurality of low refractive index layers are provided on a second electrode. Therefore, in the following description, different parts will be described in detail, but common parts will not be described. In addition, in the drawings used for description, the same reference numerals denote elements the same as in FIG. 1 to FIG. 12.

FIG. 17 is a diagram showing a configuration of a light emitting element in the organic EL device according to the fifth embodiment.

As shown in FIG. 17, the organic EL device of the present embodiment includes a light emitting element that includes the first electrode 4, an organic layer 51 containing an n-type electron transporting layer (n-ETL), a second electrode 53 made of ITO, the cap layer 54, a first low refractive index layer (a low refractive index layer) 55, a second low refractive index layer (a low refractive index layer) 56 and a third low refractive index layer (a low refractive index layer) 57.

The organic layer 51 includes the hole injecting layer 14, the hole transporting layer 15, the light emitting layer 16 and a doping layer 52. The doping layer 52 is the same as the doping layer 31 described in the third embodiment.

The cap layer 54 is laminated on the second electrode 53. A cap layer 64 functions as a protective layer of the second electrode 53 and also functions as an optical adjustment layer. The cap layer 54 is formed by depositing, for example, an organic material. A refractive index of the cap layer 54 is 1.8.

The first low refractive index layer 55, the second low refractive index layer 56 and the third low refractive index layer 57 are laminated on the cap layer 64 in that order. The first low refractive index layer 55, the second low refractive index layer 56 and the third low refractive index layer 57 have different refractive indexes.

Here, when a refractive index of the first low refractive index layer 55 is set as n1, a refractive index of the second low refractive index layer 56 is set as n2, and a refractive index of the third low refractive index layer 57 is set as n3, the relationship of n1>n2>n3 is satisfied. Specifically, the refractive index n1 of the first low refractive index layer 55 is 1.65, the refractive index n2 of the second low refractive index layer 56 is 1.40, and the refractive index n3 of the third low refractive index layer 57 is 1.30.

In this manner, in the present embodiment, a plurality of transparent layers whose refractive indexes are different are laminated so that the refractive index gradually decreases advancing to the upper layer away from the cap layer 54. The first low refractive index layer 55, the second low refractive index layer 56 and the third low refractive index layer 57 are preliminarily laminated in a sheet form, which is bonded to a surface of the cap layer 54 through an adhesion layer (not shown).

As in the third embodiment described above, the present embodiment includes the second electrode 53 made of only ITO. When a transparent conductive film is used as the second electrode 53, it is possible to significantly improve light extraction efficiency.

However, since the refractive index of ITO is about 1.9 to 2.0, when light is emitted from the ITO film to the outside, surface reflection occurs at the interface due to a refractive index difference between the ITO film and an air layer. In consideration of the refractive index of the ITO film, light emitted in the forward direction also has a loss (reflection) of about 10%.

Here, when a refractive index difference is reduced and thus a loss at the interface can be reduced, it is possible to further improve light extraction efficiency. For this purpose, a layer having a lower refractive index than that of ITO may be laminated. In the present embodiment, the plurality of low refractive index layers 55, 56, and 57 having a lower refractive index than that of ITO are laminated on the second electrode 53 made of ITO. Since layers having a lower refractive index are laminated at higher positions, no surface reflection occurs at the interfaces of the low refractive index layers 55, 56, and 57. In addition, since a refractive index difference between the third low refractive index layer 57, which is the uppermost layer, and an air layer is smaller than a refractive index difference between ITO and an air layer, it is possible to effectively minimize surface reflection at the interface. As a result, a loss of light is significantly minimized, and it is possible to improve light extraction efficiency.

In order to verify an effect of the organic EL device of the above-described present embodiment, the inventors compared the organic EL device of the fifth embodiment and the organic EL device of the above-described third embodiment.

Comparisons between optical properties of the organic EL devices according to the fifth embodiment and the third embodiment are shown in, for example, [Table 4].

TABLE 4

|  | Reflectance of second electrode | Surface reflectance | Forward luminance at TE luminance ratio |
|---|---|---|---|
| Third embodiment | 0% (transmittance 85%) | 10% | 170% |
| Fifth embodiment | 0% (transmittance 83%) | 3% | 190% |

In the organic EL device of the third embodiment, when the light reflectance of the second electrode made of ITO was 0% (transmittance 85%), a surface reflectance at the interface with the air layer was 10%. In addition, the relative intensity of the forward luminance when the luminance of a green light emitting element was 1 was 170%.

On the other hand, in the organic EL device of the fifth embodiment, when the light reflectance was 0% (transmittance 83%) in the laminated structure of the second electrode 53 made of ITO and the above plurality of low refractive index layers 55, 56, and 57, a surface reflectance at the interface between the air layer and the low refractive index layer 57 was 3%, which was significantly lower than that of the configuration including only ITO. As a result, the above relative intensity of the forward luminance increased to 190%.

As described above, it has been found that, when surface reflection at the interface with the air layer is reduced, light extraction efficiency is improved and the forward luminance of the organic EL device increases.

Sixth Embodiment

Next, an organic EL device according to a sixth embodiment of the present invention will be described.

The basic configuration of the organic EL device of the present embodiment to be described below is substantially the same as that of the first embodiment except that a refractive index adjustment layer is provided on a second electrode. Therefore, in the following description, different parts will be described in detail, but common parts will not be described. In addition, in the drawings used for description, the same reference numerals denote elements the same as in FIG. 1 to FIG. 12.

FIG. 18 is a diagram showing a configuration of a light emitting element in the organic EL device according to the sixth embodiment. FIG. 19 is a partially enlarged cross-sectional view showing a configuration of a refractive index adjustment layer.

As shown in FIG. 18, the organic EL device of the present embodiment includes a light emitting element that includes the first electrode 4, the organic layer 5 containing an n-type electron transporting layer (n-ETL), a second electrode 63 made of ITO, the cap layer 64 and a refractive index adjustment layer (a low refractive index layer) 65.

The organic layer 5 includes the hole injecting layer 14, the hole transporting layer 15, the light emitting layer 16 and a doping layer 62. The doping layer 62 is the same as the doping layer 31 described in the third embodiment.

The cap layer 64 is laminated on the second electrode 63. The cap layer 64 functions as a protective layer for protecting the second electrode 63 and functions as an optical adjustment layer. The cap layer 64 is formed by depositing, for example, an organic material. A refractive index of the cap layer 64 is 1.8.

The refractive index adjustment layer 65 is laminated on the cap layer 64. The refractive index adjustment layer 65 has a sheet form, and is attached to a surface of the cap layer 64 through an adhesive (not shown) or the like.

The refractive index adjustment layer 65 has a plurality of irregularities as shown in FIG. 19 and has a nanostructure having a waveform surface 65a. As an example, a convex portion 66 has a pitch P of 260 nm and a height H of 260 nm. Although detailed description is omitted, a structure in which, since an unevenness pattern is sufficiently smaller than a wavelength of visible light, it is not possible to identify an interface between a resin and an air layer, and a refractive index continuously changes in the film thickness direction is provided.

That is, in the refractive index adjustment layer 65, the upper part has a lower refractive index than the lower part in the layer. In the present embodiment, such a structure is made using a material having a refractive index of 1.8. Therefore, in the film thickness direction of the refractive index adjustment layer 65, the refractive index gradually changes from the second electrode 63 side to the air layer side, that is, from 1.8 to 1. Such functionality is called a moth-eye structure, and is widely applied in anti-reflection sheets. The moth-eye structure refers to a shape or a structure using the principle of a so-called "moth-eye" structure in which there are uneven shapes in which intervals therebetween are equal to or lower than a wavelength of visible light.

In the organic EL device of the present embodiment, the refractive index adjustment layer 65 having a moth-eye structure is used. Accordingly, it is possible to obtain the same effect as in the organic EL device of the fifth embodiment including a plurality of low refractive index layers only when the above refractive index adjustment layer 65 is laminated on the second electrode 63 made of ITO as a single layer. In addition, in the fifth embodiment, even if there are small refractive index differences among the plurality of low refractive index layers, since layers having different refractive indexes are laminated, considerable surface reflection occurs at the interface between the layers.

On the other hand, the present embodiment has a merit in which, since the refractive index adjustment layer 65 having a single layer structure is used, hardly any loss of light as in the laminated structure occurs.

In order to verify an effect of the organic EL device of the above-described present embodiment, the inventors compared three organic EL devices of the third embodiment, the fifth embodiment, and the sixth embodiment.

Comparisons between optical properties of the above three organic EL devices are shown in, for example, [Table 5].

Here, optical properties of the organic EL devices according to the third embodiment and the fifth embodiment are the same as those described above using Table 4.

TABLE 5

|  | Reflectance of second electrode | Surface reflectance | Forward luminance at TE luminance ratio |
|---|---|---|---|
| Third embodiment | 0% (transmittance 85%) | 10% | 170% |
| Fifth embodiment | 0% (transmittance 83%) | 3% | 190% |
| Sixth embodiment | 0% (transmittance 83%) | 1% | 200% |

On the other hand, in optical properties of the organic EL device according to the sixth embodiment, when the light reflectance of the second electrode 63 made of ITO was 0% (transmittance 83%), a surface reflection at the interface with the air layer was only 1%. Therefore, the relative intensity of the forward luminance when the luminance of a green light emitting element was 1 was improved to 200%.

In this manner, in the organic EL device of the present embodiment, according to the refractive index adjustment layer 65 laminated on the second electrode 63, it was possible to reduce surface reflection at the interface with the air layer further than in the organic EL devices of the above-described third and fifth embodiments. Accordingly, it was possible to further improve the forward luminance.

It should be noted that, while exemplary embodiments according to the present invention have been described above with reference to the appended drawings, the present invention is not limited to these embodiments. It can be clearly and easily understood by those skilled in the art that various changes or modifications can be made within the spirit and scope of the invention defined by the appended claims, and these will be construed as being included in the technical scope of the invention. Configurations of the embodiments may be appropriately combined.

Note that the technical scope of the present invention is not limited to the above embodiments, and various modifications can be made without departing from the spirit of the invention.

For example, specific configurations such as shapes, sizes, the numbers thereof, dispositions, constituent materials, and formation processes of elements of the organic EL device are not limited to those in the above embodiments, and can be appropriately changed.

In addition, the organic EL device of one aspect of the present invention can be applied to an illumination device and the like in addition to a display device. For example, when one aspect of the present invention is applied to an illumination device configured to generate white light, it is not necessary to include a plurality of unit light emitting areas which are divided from each other and have different luminescent colors as exemplified in the above embodiment. Specifically, for example, one light emitting layer may be doped with 3 kinds of dopant dye which are red, green, and blue, a laminated structure of a blue hole transporting light emitting layer, a green electron transport light emitting layer and a red electron transporting light emitting layer may be used, and a laminated structure of a blue electron transporting light emitting layer, a green electron transport light emitting layer and a red electron transporting light emitting layer may be used.

INDUSTRIAL APPLICABILITY

Some aspects of the present invention can be used for any electronic product including a light emitting unit such as a display device or an illumination device.

DESCRIPTION OF THE REFERENCE SYMBOLS

2 Base material
2a, 3a, 7a, 8a, 12a, 25a Top surface
3, 103 Reflective layer
4, 104 First electrode
5, 35, 51, 105 Organic layer
5b Bottom surface
6, 19, 30, 43, 53, 63, 106 Second electrode
9 Recess
Q Plane
12 Filling layer
16 Light emitting layer
42 Auxiliary electrode
65a Surface
L1 Light
n1, n2, n3 Refractive index
2007 Indoor illumination device (illumination device)

The invention claimed is:

1. An organic electroluminescence device comprising:
a base material having a top surface on which a recess is provided;
a reflective layer provided along at least a surface of the recess;
a filling layer filled in the recess via the reflective layer, the filling layer having light transmissivity;
a first electrode provided at least on an upper layer side of the filling layer, the first electrode having light transmissivity;
an organic layer provided on an upper layer side of the first electrode, the organic layer comprising at least a light emitting layer;
a second electrode provided on an upper layer side of the organic layer, the second electrode having light transmissivity; and
low refractive index layers whose refractive indexes are lower than that of the second electrode, the low refractive index layers being provided on the second electrode,
wherein the second electrode has a reflectance of 70% or less.

2. The organic electroluminescence device according to claim 1,
wherein the second electrode has a light transmittance of 30% or more.

3. The organic electroluminescence device according to claim 1,
wherein the second electrode comprises a metal layer.

4. The organic electroluminescence device according to claim 3,
wherein a transparent conductive film is laminated on the metal layer.

5. The organic electroluminescence device according to claim 1,
wherein the second electrode is a transparent conductive film.

6. The organic electroluminescence device according to claim 5,
wherein the organic layer comprises a doping layer that is obtained by doping an electron transporting material with a metal or a metal compound and has an electron injection function.

7. The organic electroluminescence device according to claim 1,
wherein an auxiliary electrode made of a metal that is electrically connected to the second electrode is provided.

8. The organic electroluminescence device according to claim 1,
wherein the plurality of low refractive index layers are laminated on the second electrode.

9. The organic electroluminescence device according to claim 8,
wherein, among the plurality of low refractive index layers, the low refractive index layer on the upper layer side has a lower refractive index than that of the low refractive index layer on the lower layer side.

10. The organic electroluminescence device according to claim 1,
   wherein an upper part has a lower refractive index than that of a lower part in the low refractive index layer.

11. The organic electroluminescence device according to claim 1,
   wherein a part of the reflective layer is in contact with a part of the first electrode.

12. The organic electroluminescence device according to claim 1,
   wherein a bottom surface of the first electrode at a position of the recess is positioned lower than a plane including a top surface of the base material.

13. The organic electroluminescence device according to claim 1,
   wherein the recess has a cross-sectional shape in at least one axial direction that is an arc shape.

14. An organic electroluminescence device comprising:
   a base material having a top surface on which a recess is provided;
   a reflective layer provided along at least a surface of the recess;
   a filling layer filled in the recess via the reflective layer, the filling layer having light transmissivity;
   a first electrode provided at least on an upper layer side of the filling layer, the first electrode having light transmissivity;
   an organic layer provided on an upper layer side of the first electrode, the organic layer comprising at least a light emitting layer; and
   a second electrode provided on an upper layer side of the organic layer, the second electrode having light transmissivity,
   wherein the second electrode has a reflectance of 70% or less, and
   a bottom surface of the first electrode at a position of the recess is positioned lower than a plane including a top surface of the base material.

15. The organic electroluminescence device according to claim 14,
   wherein the second electrode has a light transmittance of 30% or more.

16. The organic electroluminescence device according to claim 14,
   wherein the second electrode comprises a metal layer.

17. The organic electroluminescence device according to claim 16,
   wherein a transparent conductive film is laminated on the metal layer.

18. The organic electroluminescence device according to claim 14,
   wherein the second electrode is a transparent conductive film.

19. The organic electroluminescence device according to claim 14,
   wherein an auxiliary electrode made of a metal that is electrically connected to the second electrode is provided.

20. The organic electroluminescence device according to claim 14,
   wherein the recess has a cross-sectional shape in at least one axial direction that is an arc shape.

* * * * *